(12) United States Patent
Tanimoto et al.

(10) Patent No.: US 7,619,473 B2
(45) Date of Patent: Nov. 17, 2009

(54) FULLY-DIFFERENTIAL AMPLIFIER

(75) Inventors: Hiroshi Tanimoto, Kitami (JP); Masayuki Katakura, Ebina (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 54 days.

(21) Appl. No.: 11/812,378

(22) Filed: Jun. 18, 2007

(65) Prior Publication Data

US 2008/0143439 A1 Jun. 19, 2008

(30) Foreign Application Priority Data

Dec. 14, 2006 (JP) ............................. 2006-336928

(51) Int. Cl.
*H03F 3/45* (2006.01)
(52) U.S. Cl. ...................................... 330/253; 330/258
(58) Field of Classification Search ................. 330/253, 330/258, 69, 261; 327/307
See application file for complete search history.

(56) References Cited

U.S. PATENT DOCUMENTS 7,009,448 B2 * 3/2006 Itakura et al. ................. 330/69
2005/0285672 A1 12/2005 Itakura et al.

FOREIGN PATENT DOCUMENTS

| JP | 2004-007362 | 1/2004 |
|---|---|---|
| JP | 2004-304426 | 10/2004 |
| JP | 2005-109983 | 4/2005 |

OTHER PUBLICATIONS

Zdislaw Czarnul et al., "Design of fully balanced analog systems based on ordinary and / or modified single-ended opamps", IEICE Transactions on Fundamentals, vol. E82-A, No. 2, pp. 256-270, Feb. 1999.
Ahmed Nader Mohieldin et al., "A Fully Balanced Pseudo-Differential OTA With Common-Mode Feedfoward and Inherent Common-Mode Feedback Detector", IEEE Journal of Solid-State Circuits, vol. 38, No. 4, pp. 663-668, Apr. 2003.
T. Ueno and T. Itakura, "A 0.9V 1.5mW Continuous Time Modulator for W-CDMA", IEICE Trans. on Fundamentals, vol. E-88A, No. 2, pp. 461-468, Feb. 2005.
S. Chatterjee, Y. Tsividis, P. Kinget, "A 0.5V Filter with PLL-Based Tuning in 0.18 μm CMOS,"Digest of Technical Papers, IEEE ISSCC2005, 27.8, pp. 506-507, Feb. 2005.

(Continued)

*Primary Examiner*—Robert Pascal
*Assistant Examiner*—Khiem D Nguyen
(74) *Attorney, Agent, or Firm*—Staas & Halsey LLP

(57) ABSTRACT

A fully-differential amplifier able to operate at a low power supply voltage and provided with a common-mode signal suppression function is disclosed. This fully-differential amplifier is provided with a first fully-differential amplifier configured by a single-stage configuration inverting amplifier and canceling out the common-mode signal of the input side by a feedforward means and a second fully-differential amplifier configured by a single-stage configuration inverting amplifier and canceling out the common-mode signal of the output side by a feedback means, the output of the first fully-differential amplifier being connected to the input of the second fully-differential amplifier.

9 Claims, 12 Drawing Sheets

OTHER PUBLICATIONS

S. Chatterjee, Y. Tsividis, P. Kinget, "0.5-V Analog Circuit Techniques and Their Application in OTA and Filter Design," IEEE Journal of Solid-State Circuits, vol. 40, No. 12, pp. 2373-2387, Dec. 2005.

Bram Nauta, "CMOS Transconductor-C Filter Technique for Very High Frequencies", IEEE Journal of Solid-State Circuits, vol. 27, No. 2, pp. 142-153, Feb. 1992.

Eiichi Yoshida, Hiroshi Tanimoto, "Common Mode Input Range Study of Pseudo Differential OTA Using CMOS Inventers" The papers of Technical Meeting on Electronic Circuits, IEE Japan ECT-06-52-69, Jun. 22-23, 2006.

Japanese Office Action issued on Jan. 6, 2009 in corresponding Japanese Patent Application, 2006-336928.

Japanese Office Action dated Aug. 4, 2009 issued in priority Japanese Application No. 2006-336928.

* cited by examiner

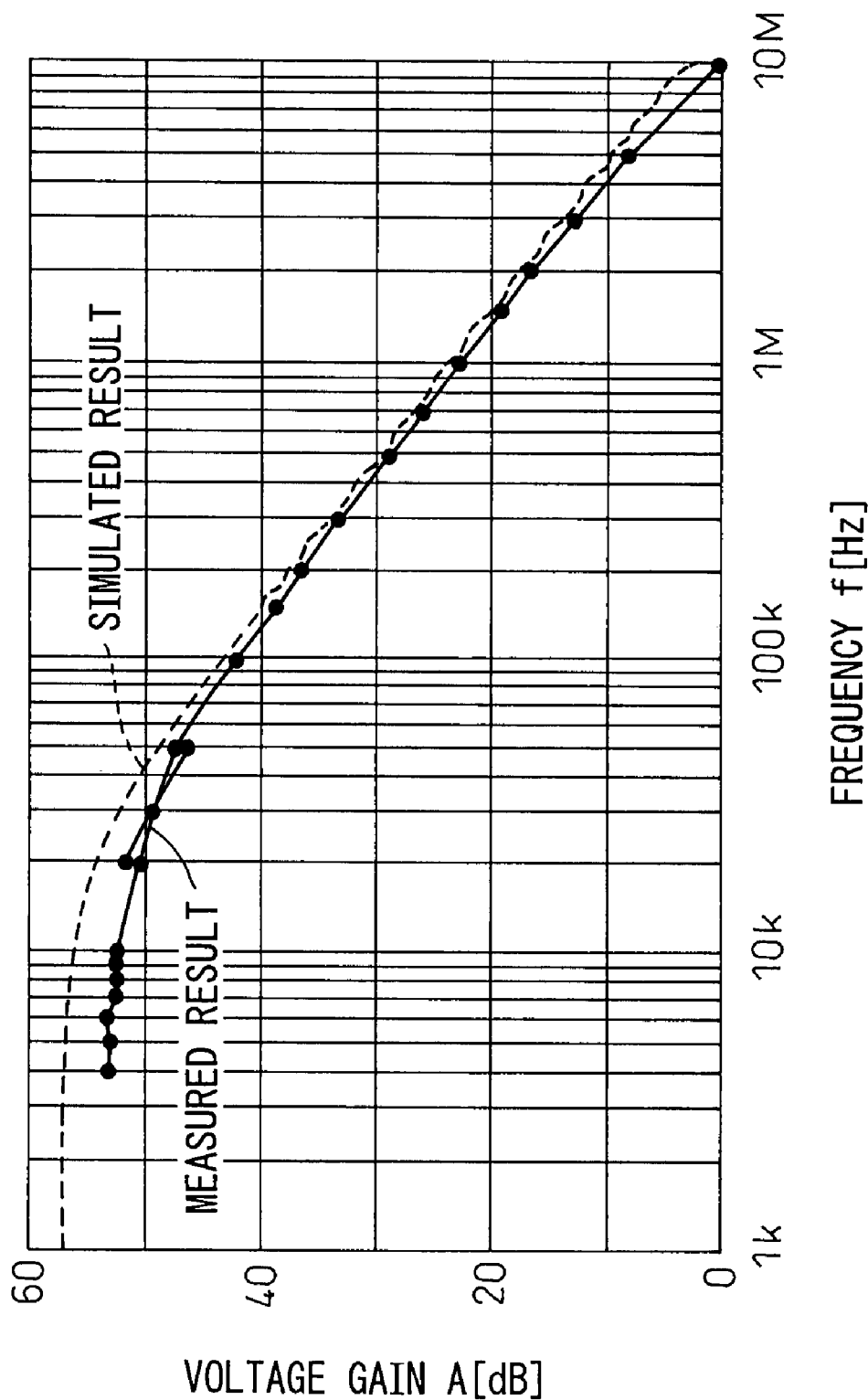

FULLY-DIFFERENTIAL AMPLIFIER

CROSS REFERENCE TO RELATED APPLICATIONS

This application claims the benefit of Japanese Patent Application No. 2006-336928 filed on Dec. 14, 2006, the disclosure of which is hereby incorporated herein by reference.

BACKGROUND OF THE INVENTION

The present invention relates to a fully-differential amplifier and a circuit utilizing the same, more particularly relates to a fully-differential amplifier able to give a large output amplification even with a low voltage power supply and a filter using the same.

A fully-differential amplifier is an amplifier having two input terminals and two output terminals. A fully-differential amplifier has the property of suppressing the common-mode components of the two input signals and amplifying and outputting the differential components of the two input signals, so is characterized by the ability to suppress fluctuations in the power supply voltage, fluctuations in the ambient temperature, and noise signals mixed in as a common-mode signal at the two input terminals. Further, at the two output terminals, the output signals appear as signals of reverse phases, so these differential signal components have twice the signal amplitude of a single output terminal. Even when the power supply voltage is low, a larger output amplification can be obtained compared with a single-ended amplifier. Due to this feature, fully-differential amplifiers are being broadly used for mixed digital-analog circuits or circuits operating at a low power supply voltage.

In a conventional fully-differential amplifier, the common-mode signal is generally suppressed by the use of a differential pair and common-mode feedback (hereinafter referred to as "CMFB") circuit. FIG. 1 is a view for explaining the configuration of a conventional common-mode feedback circuit. In FIG. 1, the transistors M1, M2 forming the differential pair have sources connected in common and are supplied with current from the transistor MS forming the current source, so the degree of amplification of common-mode input signals is extremely small. For this reason, if the voltages of the signals IN1, IN2 applied to the input terminals 10, 12 are Vin1, Vin2, the common-mode component of the input signals, that is, (Vin1+Vin2)/2, amplified and transmitted to the output side can be ignored. However, the output resistances of the transistors M1, M2 and the output resistances of the transistors M3, M4 become extremely large. Further, there are manufacturing variations. Therefore, if the voltages of the output signals OUT1, OUT2 output to the output terminals 11, 13 are Vout1, Vout2, the common-mode component (Vout1+Vout2)/2 of the output voltages greatly fluctuate and cannot be predicted by the differential pair itself. For this reason, a common-mode voltage detection circuit (CM-det.) 15 is used to detect the common-mode components of the outputs, an amplifier 16 is used to compare the common-mode component with the reference voltage VCMref supplied to the terminal 17 and amplify the difference, and that signal is fed back to the transistors M3, M4 forming the current source load of the differential pair. By adopting this configuration, the common-mode voltage of the outputs OUT1 and OUT2 substantially becomes the reference voltage VCMref. Here, the part formed by the CM-det.15 and amplifier 16 is called the "common-mode feedback circuit (CMFB) 14".

On the other hand, in the conventional configuration of a fully-differential amplifier using a differential pair, the voltage applied to the transistors forming the circuit for normal operation of the circuit has to be VDSsat or more. In FIG. 1, if considering the lowest power supply voltage required for this circuit to normally operate, with current technology, since VDSsat is about 0.3V, it is learned that the power supply voltage has to be 3VDSsat, that is, a minimum of about 0.9V+Vswing. Here, Vswing is the amplitude of the output voltage obtained from one output terminal. For this reason, if the power supply voltage is 1.0V, Vswing is 0.1V. The amplitude of the output is ±0.1V, in practice it is too small, so when the power voltage is small, a fully-differential amplifier using a differential pair cannot be expected to satisfactorily operate. Further, with a power supply voltage of 0.9V or less, the amplitude of the output amplification becomes zero and normal operation cannot be expected. Note that the increasing miniaturization of devices is causing a decline in the withstand voltage of devices. For example, with the current 90 nanometer process, the power supply voltage falls to 1V. The increasing miniaturization of devices will continue in the future. Around the year 2010, the 45 nanometer process will be commercialized and that power supply voltage is projected to fall to 0.6V or so. In this way, in the future, it is clear that so long as using a conventional differential pair, a fully-differential amplifier will not be able to function.

As explained above, a fully-differential amplifier of a configuration using a differential pair and a common-mode feedback circuit for suppressing the common-mode signal itself has been well known in the past. In addition to this, a fully-differential amplifier of a configuration using a differential pair, common-mode feedback (hereinafter referred to as "CMFB") circuit, and common-mode feedforward (hereinafter abbreviated as "CMFF") circuit for suppressing the common-mode signal has been proposed in Zdislaw Czarnul et al., "Design of fully balanced analog systems based on ordinary and/or modified single-ended opamps", *IEICE Transactions on Fundamentals*, Vol. E82-A, No. 2, pp. 256-270, February 1999 etc. However, even the circuit proposed by Zdislaw Czarnul et al., like a conventional fully-differential amplifier, will probably not operate satisfactorily with a low power supply voltage of 1V or less so long as using a differential pair. Even if it is able to cancel out the common-mode input signals by just a feedforward operation, if it is used in a filter etc. to form an integrator having a capacitor as a load, since there is no feedback route to the fully-differential amplifier itself, the problem arises that the common-mode voltages of the outputs cannot be freely set.

In the above way, if the power supply voltage is low, good operation of a fully-differential amplifier using a differential pair becomes difficult, so for use in that case, a fully-differential amplifier of a configuration not using a differential pair, but using a common-mode inverting amplifier and a common-mode feedforward circuit has been proposed in Ahmed Nader Mohieldin et al., "A Fully Balanced Pseudo-Differential OTA With Common-Mode Feedforward and Inherent Common-Mode Feedback Detector", *IEEE Journal of Solid-State Circuits*, Vol. 38, No. 4, pp. 66-668, April 2003, T. Ueno and T. Itakura, "A 0.9V 1.5 mW Continuous Time Modulator for W-CDMA", *IEICE Trans. on Fundamentals*, Vol. E-88A, No. 2, pp. 461-468, February 2005, Japanese Patent Publication (A) No. 2004-7362, etc. The fully-differential amplifiers disclosed in these publications operate with a 0.9V power supply voltage.

FIG. 2A is a circuit diagram for explaining the configuration of a single-stage single-end inverting amplifier. In this circuit, a P-channel transistor M12 forming the current source load is arranged in series with an N-channel MOS transistor M11. The gate of the transistor M11 forms the input terminal 10, while the drain forms the output terminal 11. Of course, it is possible to similarly form a single-stage single-end inverting amplifier even if using M11 as the current source load and M12 as the amplification element, but for convenience in explanation, here the explanation will be given assuming the configuration of FIG. 2A. Note that if replacing the transistor M11 in FIG. 2A with a small signal equivalent circuit, an equivalent circuit for a small signal of FIG. 2B is obtained. In FIG. 2B, gm indicates the mutual conductance of the transistor M11, roN indicates the output resistance of the transistor M11, and roP indicates the output resistance of the transistor M12. FIG. 2B shows the equivalent circuit, excluding the parasitic capacitances standing at a low frequency. If using this to calculate the output voltage Vout for the input voltage Vin, Vout=−gm×(roN∥roP)×Vin is obtained, so the magnitude of the voltage gain of this circuit is expressed as gm×(roN∥roP). Here, (roN|roP) indicates the resistance value in the case where roN and roP are connected in parallel. The lowest power supply voltage for this circuit to normally operate is 2VDSsat+Vswing which becomes about 0.6V or more. For example, if the power supply voltage is 1V, it is possible to vary the voltage of the output in a normal operation by 0.4V or so. Compared with the case of use of a differential pair, operation by a lower power supply voltage is possible.

However, when the amplification element forming the single-stage single-end inverting amplifier is an MOS transistor, the transconductance gm of the transistor increases proportionally to the square root of the bias current. The output resistances roN and roP are proportional to the reciprocal of the bias current, so the voltage gain given by the product of the gm of the amplification circuit and the output resistance (roN∥roP) will not increase, but will conversely decrease, even if increasing the operating current. On the other hand, if the gate length of the MOS transistor is L, gm is inversely proportional to the square root of L and roN and roP are proportional to L, so if increasing L, the voltage gain increases in proportion to the square root of L. That is, when using a MOS transistor to form an amplifier, even if just increasing the bias current, the gain will not increase. Unless increasing the gate length L, the gain will not increase. Therefore, if making MOS transistors finer, since the gate length L will become smaller, there is the problem that inevitably the voltage gain of the single-stage single-end inverting amplification circuit will be lowered.

S. Chatterjee, Y. Tsividis, P. Kinget, "A 0.5V Filter with PLL-Based Tuning in 0.18 μm CMOS," *Digest of Technical Papers, IEEE ISSCC* 2005, 27.8, pp. 506-507, February 2005, FIG. 27.8.1 and S. Chatterjee, Y. Tsividis, P. Kinget, "0.5-V Analog Circuit Techniques and Their Application in OTA and Filter Design," *IEEE Journal of Solid-State Circuits*, Vol. 40, No. 12, pp. 2373-2387, December 2005, FIG. 5 are examples of a fully-differential amplifier formed using the single-end inverting amplifier shown in FIG. 2A. This fully-differential amplifier is configured providing a single-stage inverting amplification circuit with both a mechanism suppressing the common-mode components of the input signals by a feedforward operation and a mechanism controlling the common-mode voltages of the outputs by a feedback operation. That is, first, a common-mode feedback means suppressing the common-mode signal of the outputs by a mechanism similar to the circuit of FIG. 1 is used. With just this mechanism, the common-mode voltages of the outputs can be controlled to a certain extent, but since no differential pair is used, the gain with respect to the common-mode signal is large, so to sufficiently stabilize the common-mode voltages of the outputs, it is necessary to further suppress the common-mode signal components of the inputs. For this reason, in this fully-differential amplifier, the feedforward operation proposed by Ahmed Nader Mohieldin et al., "A Fully Balanced Pseudo-Differential OTA With Common-Mode Feedforward and Inherent Common-Mode Feedback Detector", *IEEE Journal of Solid-State Circuits*, Vol. 38, No. 4, pp. 663-668, April 2003 may be jointly used to simultaneously suppress the common-mode components of the input signals in the single-stage configuration fully-differential amplifier. Note that the design of this fully-differential amplifier uses the 0.18 μm process, so with single-stage amplification, the gain is insufficient. As shown in S. Chatterjee, Y. Tsividis, P. Kinget, "0.5-V Analog Circuit Techniques and Their Application in OTA and Filter Design," *IEEE Journal of Solid-State Circuits,* Vol. 40, No. 12, pp. 2373-2387, December 2005, FIG. 6, two of the basically same single-stage inverting amplification circuits are cascade connected to try to increase the gain.

T. Ueno and T. Itakura, "A 0.9V 1.5 mW Continuous Time Modulator for W-CDMA", *IEICE Trans. on Fundamentals,* Vol. E-88A, No. 2, pp. 461-468, February 2005 and Japanese Patent Publication (A) No. 2004-7362 realize fully-differential amplifiers suppressing the common-mode input signals by feedforward means based on single-stage single-end inverting amplifiers of FIG. 2A instead of the conventional differential pair. In this fully-differential amplifier, no mechanism of common-mode feedback is provided for controlling the common-mode voltage of the outputs. For this reason, with this fully-differential amplifier itself, the common-mode voltage of the output side cannot be set. Further, in this fully-differential amplifier as well, it is difficult to obtain a sufficient gain by a single stage, so in practice a two-stage amplifier is formed.

Here, the basic thinking behind the technique for suppressing the common-mode components will be explained. To suppress the common-mode components, it is necessary to detect the common-mode components and cancel out the common-mode components. There are basically four methods regarding where to detect the common-mode components and where to cancel them out. FIG. 3A is a view explaining the basic thinking behind the technique of suppressing the common-mode component of input signals by a feedforward operation comprising detecting the common-mode component at the input terminals and canceling them out at the output terminals. Here, the symbols of the inverters used in FIG. 3A and FIG. 3B are symbols expressing single-stage configuration inverting amplifiers having the transconductance value gm. The input signal IN1 input to the input terminal 10 is amplified by the single-stage inverting amplifiers 21, 22, while the input signal IN2 input to the input terminal 12 is amplified by the single-stage inverting amplifiers 23, 24. The outputs of the single-stage inverting amplifiers 22, 23 are added by the adder 25, an output proportional to the common-mode signal of the inputs is generated, and the output is multiplied by ½ by the scale multiplier 26. The adder (subtractor) 27 subtracts from the output of the single-stage inverting amplifier 21 the output of the scale multiplier 26 and outputs the result to the output terminal 11 as the output signal OUT1, while the adder (subtractor) 28 subtracts from the output of the single-stage inverting amplifier 24 the output of the scale multiplier 26 and outputs the result to the output terminal 13 as the output signal OUT2.

If expressing the voltages V1, V2 of the input signals IN1, IN2 of the two input terminals 10 and 12 broken down into the differential component Vid and common-mode component Vic, V1=Vid+Vic, V2=−Vid+Vic. Here, Vid=(V1−V2)/2, Vic=(V1+V2)/2. Further, the output currents of the single-stage inverting amplifiers 22 and 23 are V1 and V2 multiplied with gm, so the output current of the scale multiplier 26 obtained by adding these and dividing them into ½ becomes gm(V1+V2)/2=gmVic, that is, a signal proportional to the common-mode component of the input signals. On the other hand, the output current of the single-stage inverting amplifier 21 is gmV1, so the output current at the output terminal 11 comprised of this value minus the output signal of the inverter 56 through the adder 57 becomes gm(Vid+Vic)−gmVic=gmVid, while the voltage V3 of the output signal OUT1 at the output terminal 11 is comprised of only components proportional to the differential signal component Vid. In exactly the same way, the voltage V4 of the output signal OUT2 at the output terminal 13 becomes gm(−Vid+Vic)−gmVic=−gmVid and again is comprised of only components proportional to the differential signal component Vid. At this time, at the output terminals 11 and 13, outputs of reverse signs proportional to the differential components of the input signals are obtained. Overall, the common-mode signal is suppressed, and only the differential signal is output.

Further, since the circuit of FIG. 2A is used as the unit element amplifier, operation at about 0.6V is possible. Compared to a differential pair, operation at a considerably low power supply voltage is possible, but for normal operation, it is necessary that the common-mode voltage of the input side of the unit element amplifier and the common-mode voltage of the output side differ considerably. In the example shown by S. Chatterjee, Y. Tsividis, P. Kinget, "0.5-V Analog Circuit Techniques and Their Application in OTA and Filter Design," *IEEE Journal of Solid-State Circuits*, Vol. 40, No. 12, pp. 2373-2387, December 2005, when the power supply voltage is 0.5V, the common-mode voltage of the output side is 0.25V, while the common-mode voltage of the input side has to be made 0.4V. In most cases, the common-mode voltage of the input signal source is ½ the power supply voltage, so is 0.25V. It is necessary to shift the level of this to 0.4V. This situation is the same even in the fully-differential amplifier of T. Ueno and T. Itakura, "A 0.9V 1.5 mW Continuous Time Modulator for W-CDMA", *IEICE Trans. on Fundamentals*, Vol. E-88A, No. 2, pp. 461-468, February 2005 and Japanese Patent Publication (A) No. 2004-7362. A circuit for a level shift is added to the input side. The need for this level shift circuit complicates the circuit design and increases the current consumption of the circuit, so this is not preferable.

FIG. 3B is a view for explaining the basic thinking behind the technique of suppressing the common-mode component of input signals by a feedback operation comprising detecting the common-mode component at the output terminals and canceling them at the input terminals. The single-stage inverting amplifiers 31, 32 of the circuit of FIG. 3B correspond to the single-stage inverting amplifiers 21, 24 of the circuit of FIG. 3A. The other parts are reversed at the input side and output side. The explanation of the circuit operation will be omitted.

In addition, there are the method of detecting the common-mode component at the input terminals and canceling them out at the input terminals, the technique, such as described in Bram Nauta, "CMOS Transconductor-C Filter Technique for Very High Frequencies", *IEEE Journal of Solid-State Circuits*, Vol. 27, No. 2, pp. 142-153, February 1992, of detecting the common-mode component at the output terminals and canceling them out at the output terminals, etc.

As the single-stage single-end inverting amplifier, not only the one shown in FIG. 2A, but also the CMOS inverter shown in FIG. 4A may be utilized. FIG. 4B is a small signal equivalent circuit of the circuit of FIG. 4A. This CMOS inverter is inherently a digital circuit which operates as a NOT circuit, but as an analog circuit it operates as a single-end inverting amplifier. A CMOS inverter (hereinafter abbreviated as the "inverter"), as shown in FIG. 4A, is configured to input a signal to the transistor M2 operating at a current source load in FIG. 2A, so as clear from FIG. 4B, the transistor M2 also becomes involved in amplification and that voltage gain becomes −(gmN+gmp)×(roN∥roP). That is, there is the feature that in the case of the same operating current, the gain is larger than even the circuit of FIG. 2A (in normal design, about two times larger). Further, since complementary symmetric MOSFETs are used for configuration, the lowest power supply voltage enabling operation becomes higher than the circuit of FIG. 2B, but there is the advantage that the input side common-mode voltage and the output side common-mode voltage are automatically set to substantially ½ of the power supply voltage. Below, a CMOS inverter will be expressed by the symbol shown in FIG. 4C.

Bram Nauta, "CMOS Transconductor-C Filter Technique for Very High Frequencies", *IEEE Journal of Solid-State Circuits*, Vol. 27, No. 2, pp. 142-153, February 1992, describes an example of use of this CMOS inverter to form a fully-differential amplifier. Here, for a balanced amplifier comprised of CMOS inverters, a fully-differential amplification circuit providing a load exhibiting a higher impedance with respect to the differential signal and exhibiting a lower impedance compared with a common-mode signal is proposed (hereinafter this fully-differential amplifier will be referred to as a "Nauta OTA"). This fully-differential amplification circuit was not devised for the purpose of operating at a low power supply voltage, but according to this circuit configuration, the voltage gain with respect to the input side common-mode signal is extremely low and the voltage gain with respect to the differential signal is extremely high. Not only this, since no differential pair is used as the amplification circuit element, operation by a lower power supply voltage becomes possible.

At the time Zdislaw Czarnul, "Design of fully balanced analog systems based on ordinary and/or modified single-ended opamps", *IEICE Transactions on Fundamentals*, Vol. E82-A, No. 2, pp. 256-270, February 1999 and the Nauta OTA were announced, the gate lengths of CMOS's were 3 µm and the power supply voltages were also sufficiently large 10V or so, so the voltage gain was 200× or so or values sufficient for numerous applications.

However, in recent circuits using the micro CMOS devices, the output resistances of the MOS's are low, so not only with a Nauta OTA based on a CMOS inverter single-stage amplification circuit, but also a fully-differential amplifier described in FIG. 2A, a sufficient voltage gain cannot be obtained. For example, the differential voltage gain of the Nauta OTA is typically about 20 times or so per stage having the gate length as the smallest width by the 0.18 micron process. This extent of voltage gain is insufficient for most applications. For example, to keep down the precision of gain setting at the time of negative feedback to 1% or less, it is well known that the differential voltage gain has to be 100 times or more. To overcome this problem, the method of using multi-stage amplification circuits has been proposed.

For example, as the simplest example of a multistage amplification circuit, if trying to construct a two-stage configuration fully-differential amplifier using single-end single-stage amplification circuits as unit circuits, since the amplification circuit with two stages of inverting amplifiers superposed becomes a positive mode amplifier, as shown in FIG. 5, it may be considered to cross the outputs and deem the result an apparent inverting amplification circuit. However, if using this circuit as an operational amplifier and providing feedback resistances there, it operates to provide negative feedback to the differential signal, but it operates to give a positive feedback to the common-mode signal. As is, oscillation is liable. To eliminate the possibility of this oscillation, it is necessary to greatly suppress the gain of this circuit with respect to the common-mode signal.

Therefore, not a single inverter, but a two-stage cascade connection of Nauta OTA's with common-mode suppression actions may be considered, but in that case, the Nauta OTA's have the common-mode suppression effect, so the common-mode voltage gain is about $-\frac{1}{2}$ time, so if connecting two stages by a cascade configuration, it becomes about $\frac{1}{4}$. If applying feedback to such a two-stage connection configuration, the loop gain is 1 or less, so oscillation in the common mode is not possible. On the other hand, in this example, the differential voltage gain is about 20 times or so, so if connecting two stages by a cascade connection, the differential voltage gain becomes about 400 times or a sufficient value for most applications. However, the Nauta OTA cannot by itself control the common-mode voltage of the output terminals, so there is no accompanying negative feedback of the resistance of an OTA-C filter etc., so in a circuit in which an OTA is used, a separate additional circuit becomes necessary for controlling and stabilizing the common-mode voltage of the outputs, and an increase in circuit size and power consumption is invited.

SUMMARY OF THE INVENTION

As explained in detail above, in the prior art, if trying to realize a fully-differential amplifier operating at a low power supply voltage, the following problems arise.

(1) If the power supply voltage falls below 1V or so, it is not possible to utilize a conventional circuit using a differential pair for the purpose of suppressing the gain with respect to the common-mode signal. Therefore, to provide a fully-differential amplifier operating at a low power supply voltage of 1V or less, it is necessary to suppress the gain with respect to the common-mode signal without using a differential pair.

(2) In current micro CMOS process, the gain obtained by a single-stage amplification circuit is small, so to form a fully-differential amplifier able to withstand actual use, it is necessary to use a two- or more-stage multi-stage amplifier. However, with a multi-stage amplifier, there is a possibility that the feedback loop of the common-mode signal will become unstable, so a common-mode signal suppression function must be provided.

(3) To realize a general use fully-differential amplifier, a configuration is required not only having a function of suppressing the common-mode signal component of the input side, but also feeding back the common-mode signal component of the output side for setting the common-mode voltage of the output terminals to a desired voltage level.

(4) Further, it is desirable to obtain a large gain by as small a current consumption as possible.

The object of the present invention is to realize a fully-differential amplifier solving the above problems.

To realize the above object, a fully-differential amplifier of a first aspect of the present invention (A) employs single-stage configuration grounded source inverting amplifiers as basic amplifiers and forms the circuit by only the single-stage configuration inverting amplifiers and (B) cancels out the common-mode signal component of the input side by a feedforward operation or cancels out the common-mode signal component of the output side by a feedback operation.

The single-stage configuration inverting amplifier preferably is a CMOS inverter having the largest transconductance with respect to the current consumption and enables easy setting of the common-mode voltages of the input and output to close to $\frac{1}{2}$ of the power supply voltage.

Further, a fully-differential amplifier of a second aspect of the present invention (C) is configured with a fully-differential amplifier provided with the above common-mode feedforward function at a front stage and with a fully-differential amplifier provided with the above common-mode feedback function at the rear stage both connected in cascade. Due to this configuration, there is a sufficient gain and the common-mode signal of the input and output can be suppressed.

As explained above, the fully-differential amplifier of the first aspect of the present invention is comprised of CMOS inverters or other simple single-stage grounded source inverting amplifiers, so in the same way as a conventional fully-differential amplifier using a differential pair, it is possible to cancel out the common-mode components and possible to obtain large output amplification even at a low power supply voltage not enabling good operation of a differential pair.

Further, the fully-differential amplifier of the second aspect of the present invention has a cascade connection configuration of a fully-differential amplifier of a first mode canceling out common-mode component by a feedforward operation and a fully-differential amplifier of a first mode canceling out common-mode component by a feedback operation, so sufficient gain can be realized by a small power consumption even in the micro CMOS process.

BRIEF DESCRIPTION OF THE DRAWINGS

The features and advantages of the invention will be more clearly understood from the following description taken in conjunction with accompanying drawings, in which:

FIG. 14 is a graph of measured values and simulated values of frequency characteristics of voltage gain when operating the two-stage configuration fully-differential amplifier of FIG. 12B of an IC fabricated by the 0.18 micron CMOS process by a power supply voltage of 1V;

DESCRIPTION OF THE PREFERRED EMBODIMENTS

Figure 6:
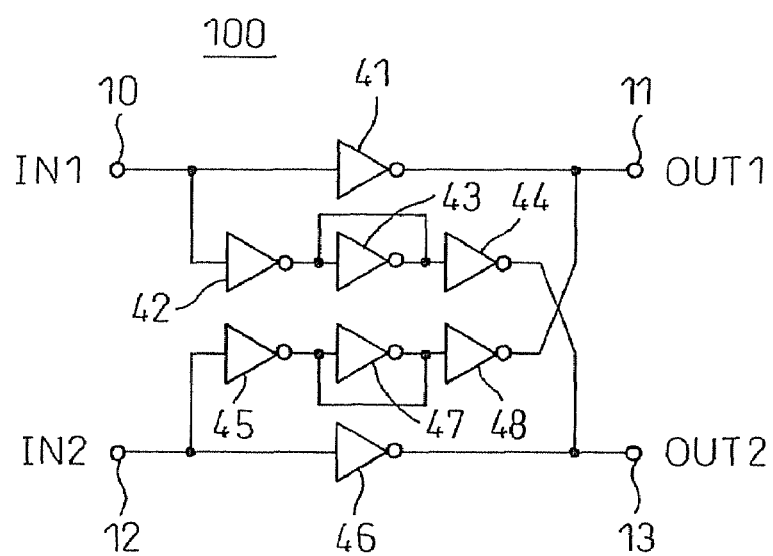
FIG. 6 is a circuit diagram of a fully-differential amplifier canceling out a common-mode signal of an input side by a feedforward operation of a first embodiment of the present invention.

FIG. 6 is a circuit diagram showing the configuration of a fully-differential amplifier 100 canceling out an input side common-mode signal by a feedforward operation according to a first embodiment of the present invention. As shown in the figure, this fully-differential amplifier 100 is a fully-differential amplifier which amplifies and inverts the voltage difference of the first and second input signals IN1, IN2 input to the first and second input terminals 10, 12 and outputs it as the first and second output signals OUT1, OUT2 to the first and second output terminals 11, 13. It is provided with a first inverter 41 connected between the first input terminal 10 and first output terminal 11, a second inverter 46 connected between the second input terminal 12 and second output terminal 13, a third inverter 42 with the first input terminal 10 as an input, a fourth inverter 43 with an input and output connected to the output of the third inverter and with the input and output short-circuited, a fifth inverter 44 with an input connected to the short-circuited input and output of the fourth inverter 43 and with an output connected to the second output terminal 13, a sixth inverter 45 with the second input terminal 12 as an input, a seventh inverter 47 with an input and output connected to the output of the sixth inverter 45 and with the input and output short-circuited, and an eighth inverter 48 with an input connected to the short-circuited input and output of the seventh inverter 47 and with an output connected to the first output terminal 11 and cancels out the common-mode signal of the input side by a feedforward operation. Note that here, the first to the eighth inverters are made CMOS inverters.

In FIG. 6, the inverters are all the same. For convenience in explanation, it is assumed that the input and output resistances are infinitely large and the transconductances are gm. The voltage of the signal IN1 input from the first input terminal 10 of FIG. 6 is output by the inverter 41 as the current amplified gm times to the first output terminal 10. At the same time as this, the signal voltage input from the first input terminal 10 is output by the inverter 42 as the current amplified gm times to the inverter 43 having the input and output short-circuited. Since the inverter 43 has the input and output short-circuited, it operates as a 1/gm resistor. Therefore, the voltage gain of the inverting amplification circuit formed by the inverter 42 and the inverter 43 becomes $-gm \times (1/gm) = -1$ time. That is, if the voltage of the input signal IN1 of the first input terminal 10 is Vi1, the output voltage of the inverter 42 (43) becomes $-Vi1$. This voltage is further amplified gm times by the inverter 44 and flows to the second output terminal 13.

On the other hand, the voltage of the signal IN2 input from the second input terminal 12 of FIG. 6 is output by the inverter 46 as the current amplified gm times to the second output terminal 13. At the same time, the voltage of the signal IN2 input from the second input terminal 12 is output by the inverter 45 as the current amplified gm times to the inverter 47 having the input and output short-circuited. The inverter 47 has the input and output short-circuited, so operates as a 1/gm resistor. Therefore, the voltage of the inverting amplification circuit formed by the inverter 45 and inverter 46 becomes $-gm \times (1/gm) = -1$ time. That is, if the voltage of the signal IN2 input from the second input terminal 12 is Vi2, the output voltage of the inverter 45 (47) becomes $-Vi2$. This voltage is further amplified by the inverter 48 by gm times and flows to the first output terminal 11.

At the first output terminal 11, the current $gm \times Vi1$ output through the inverter 41 and the current $-gm \times Vi2$ output through the inverter 48 are added. In exactly the same way, at the second output terminal 13, the current $gm \times Vi2$ output through the inverter 46 and the current $-gm \times Vi1$ output through the inverter 44 are added. In general, the two input signal voltages Vi1 and Vi2 can be expressed as follow broken down into the differential signal component Vid and common-mode signal component Vic.

$$Vi1 = +Vid + Vic \quad (1)$$

$$Vi2 = -Vid + Vic \quad (2)$$

$$\text{where, } Vid = (Vi1 - Vi2)/2 \quad (3)$$

$$Vic = (Vi1 + Vi2)/2 \quad (4)$$

Therefore, by using equations (1), (2), the current flowing to the first output terminal 11 becomes $gm \times (Vid+Vic) - gm \times (-Vid+Vic) = 2gm \times Vid$. The components relating to the common-mode component Vic of the input signal are suppressed and not output. Just the components relating to the differential component Vid of the input signal are output. In exactly the same way, the current flowing to the second output terminal 13 becomes $gm \times (-Vid+Vic) - gm \times (Vid+Vic) = -2gm \times Vid$. The components relating to the common-mode component Vic of the input signal are suppressed and not output. Just the components relating to the differential component Vid of the input signal are output. In this way, a fully-differential amplifier suppressing the common-mode component of the input signals by a feedforward operation according to the present invention is realized. Note that in an actual CMOS inverter, the output resistance ro is not infinitely large, so the common-mode signal components are not completely cancelled out by said feedforward operation, but ro has a far larger value compared with 1/gm, so the cancellation effect is also extremely large. In practice as well, the explanation stands well. In the explanation of the other embodiments below as well, the effect of ro is ignored, but similarly there is little effect of ignoring the ro.

Figure 7:
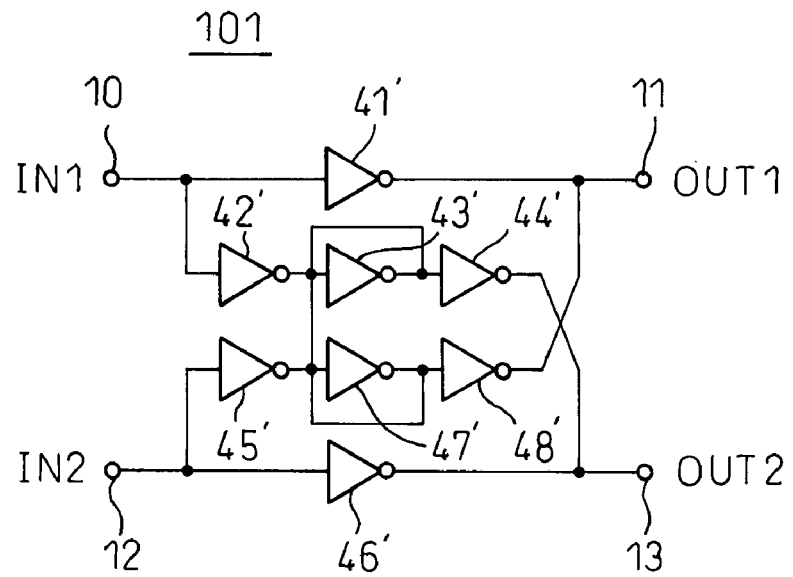
FIG. 7 is a circuit diagram of a fully-differential amplifier canceling out a common-mode signal of an input side by a feedforward operation of a second embodiment of the present invention.

FIG. 7 is a circuit diagram showing the configuration of a fully-differential amplifier 101 of a second embodiment of the present invention. Here as well, the inverters are all CMOS inverters and identical. For convenience in explanation, it is assumed that the input-output resistances are infinitely large and the transconductances are gm. As shown in FIG. 7, the fully-differential amplifier 101 of the second embodiment is a fully-differential amplifier which amplifies and inverts the voltage difference of the first and second input signals IN1, IN2 input to the first and second input terminals 10, 12 and outputs it to the first and second output terminals 11, 13 as the first and second output signals OUT1, OUT2. It is provided with a first inverter 41' connected between the first input terminal 10 and first output terminal 11, a second inverter 46' connected between the second input terminal 12 and second output terminal 13, a third inverter 42' with the first input terminal 10 as an input, a fourth inverter 43' with an input and output connected to the output of the third inverter 42" and with the input and output short-circuited, a fifth inverter 44' with an input connected to the short-circuited input and output of the fourth inverter 43' and with an output connected to the second output terminal 13, a sixth inverter 45' with a second input terminal 12 as an input, a seventh inverter 47' with an input and output connected to the output of the sixth inverter 45' and with the input and output short-circuited, and an eighth inverter 48' with an input connected to the short-circuited input and output of the seventh inverter 47' and with an output connected to the first output terminal 11, the short-circuited input and output of the fourth inverter 43' and the short-circuited input and output of the seventh inverter 47' being short-circuited and the common-mode signal of the input side being cancelled out by a feedforward operation. Note that it is also possible to modify this to connect the output of the fifth inverter 44' to the first output terminal 11 and the output of the eighth inverter 48' to the second output terminal 13.

The signal voltage input from the first input terminal 10 of FIG. 7 is output by the inverter 41' as the current amplified gm times to the first output terminal 11. At the same time, the voltage of the signal IN1 input from the first input terminal 10 is output by the inverter 42' as the current amplified gm times to the inverter 43' having its input and output short-circuited. The inverter 43' has its input and output short-circuited, so operates as a 1/gm resistor. On the other hand, the voltage of the signal IN2 input from the second input terminal 12 of FIG. 7 is output by the inverter 46' as the current amplified gm times to the second output terminal 13. At the same time, the voltage of the signal IN2 input from the first input terminal 12 is output by the inverter 45' as the current amplified gm times to the inverter 47' with its input and output short-circuited. The inverter 47' has the input and output short-circuited, so operates as a 1/gm resistor. Here, since the inputs of the inverters 43' and 47' are short-circuited, this is equivalent to connecting a 1/(2 gm) resistance to the outputs of the inverters 42' and 45'. Therefore, the output currents of the inverter 42' and the inverter 45' are averaged at the short-circuited input terminals of the inverters 43' and 47'. That is, the voltage of this node, assuming the voltage of the first input terminal 10 is Vi1 and the voltage of the second input terminal 12 is Vi2, becomes $-(gm \times Vi1 + gm \times Vi2) \times (1/(2gm)) = -(Vi1+Vi2)/2$ or the average voltage of the two input terminals inverted, but this is just an inversion of the sign of the common-mode component Vic of the input signals. The $-Vic$ are multiplied by gm by the inverters 44' and 48' and flow to the output terminals 11 and 13. Therefore, the first output terminal 11 has a current $gm \times (Vid+Vic) + gm \times (-Vic) = gm \times Vid$ flowing to it. This current is suppressed in the common-mode component Vic of the input signal and is comprised of only the components relating to the differential component Vid of the input signal. In completely the same way, the current flowing to the second output terminal 13 becomes $gm \times (-Vid+Vic) + gm \times (-Vic) = gm \times (-Vid)$. This current is suppressed in the common-mode component Vic of the input signal and is comprised of only the components relating to the differential component Vid of the input signal. In this way, in the fully-differential amplifier according to the second embodiment of the present invention, the common-mode input signal is suppressed by the feedforward operation and it is possible to amplify only the differential signals.

Figure 8:
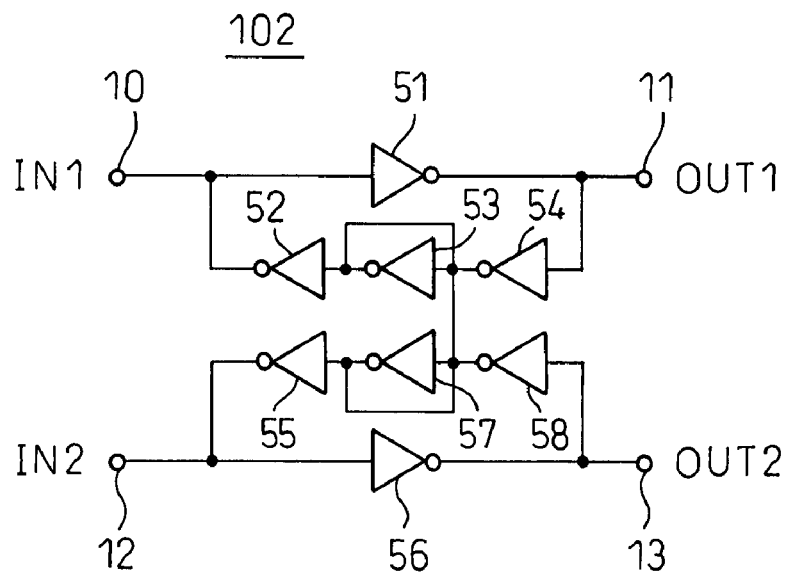
FIG. 8 is a circuit diagram of a fully-differential amplifier canceling out a common-mode signal of an output side by a feedback operation of a third embodiment of the present invention.

FIG. 8 is a circuit diagram showing the configuration of a fully-differential amplifier 102 of a third embodiment of the present invention. Here as well, the inverters are all CMOS inverters and are the same. For convenience in explanation, it is assumed that the input-output resistances are infinitely large and the transconductances are gm. As shown in FIG. 8, the fully-differential amplifier 102 of the third embodiment is a fully-differential amplifier amplifying and inverting the voltage difference between the first and second input signals IN1, IN2 input to the first and second input terminals 10, 12 and outputting it as the first and second output signals OUT1, OUT2 to the first and second output terminals 11, 13. It is provided with a first inverter 51 connected between the first input terminal 10 and first output terminal 11, a second inverter 56 connected between the second input terminal 12 and second output terminal 13, a third inverter 54 with the first output terminal 11 as an input, a fourth inverter 53 with an input and output connected to the output of the third inverter 54 and with the input and output short-circuited, a fifth inverter 52 with an input connected to a short-circuited input and output of the fourth inverter 53 and with an output connected to a first input terminal 10, a sixth inverter 58 with a second output terminal 13 as an input, a seventh inverter 57 with an input and output connected to an output of the sixth inverter 58 and with the input and output short-circuited, and an eighth inverter 55 with an input connected to a short-circuited input and output of the seventh inverter 57 and with an output connected to the second input terminal 12, the short-circuited input and output of the fourth inverter 53 and the short-circuited input and output of the seventh inverter 57 being short-circuited and the common-mode signal of the output side being cancelled out by a feedback operation. Note that this may be modified to connect the output of the fifth inverter 52 to the second input terminal 12 and connect the output of the eighth inverter 55 to the first input terminal 11.

In FIG. 8, the voltage of the signal IN1 input from the first input terminal 10 is output to the first output terminal 11 as the current amplified gm times by the inverter 51. Further, the voltage of the signal IN2 input from the second input terminal 12 is output to the second output terminal 13 as the current amplified gm times by the inverter 56. On the other hand, the signal voltage of the first output terminal 11 is output to the inverter 53 with the input and output short-circuited as the current amplified gm times by the inverter 54. The inverter 53 is short-circuited between the input and output, so operates as a 1/gm resistor. At the same time as this, the signal voltage of the second output terminal 13 is output to the inverter 57 with the input and output short-circuited as the current amplified gm times by the inverter 58. The inverter 57 has its input and output short-circuited, so operates as a 1/gm resistor. Here, the inputs of the inverters 53 and 57 are short-circuited, so this is equivalent to a 1/(2 gm) resistance being connected to the outputs of the inverters 54 (53) and 58 (57). Therefore, the output currents of the inverter 54 and inverter 58 are averaged at the short-circuited input terminals of the inverters 53 and 57. That is, the voltage of this node becomes −(gm×Vo1+gm× Vo2)×1/(2gm)=−(Vo1+Vo2)/2=−Voc when the voltage of the first output terminal 11 is Vo1 and the voltage of the second output terminal 13 is Vo2 or the inverse of the average voltage of the two output terminals, but is just an inversion of the sign of the common-mode component Voc of the output signals. The −Voc are multiplied by gm by the inverters 52 and 55 and flow to the input terminals 10 and 12. Therefore, if a signal sources having internal resistances Rs not zero are connected to the input terminals 10 and 12, feedback voltages of −gm× Rs×Voc are generated at the input terminals 10 and 12 and the common-mode voltage of the output side are suppressed by negative feedback. The voltages Vi1 and Vi2 given to the input terminals 10 and 12 from the outside are amplified gm times and flow out to the output terminals 11 and 13. At this time, in this embodiment, unlike the configuration suppressing the common-mode component of the inputs by the feedforward operation explained in the above-mentioned first and second embodiments, there is no feedforward route, so the common-mode component of the inputs are amplified and output in the same way as the differential component to the output terminals 11 and 13. However, the output common-mode component are fed back through the feedback route comprised of the inverters 54, 58, 53, 57, 52, 55, so finally the common-mode voltage component at the output terminals 11, 13 are suppressed. In this way, in a fully-differential amplifier according to the third embodiment of the present invention, the common-mode output signal is suppressed by feedback and just the differential signal can be amplified. That is, in the third embodiment, it is possible to control the common-mode voltage of the output terminals 11, 13 by a feedback operation to voltage values close to the voltages of the operating points of the inverter without greatly affected by the state of the load connected to the output side. This is because in the fully-differential amplifiers of the first and second embodiments, the common-mode voltage of the output side is not fed back, so there is a great advantage compared with the possible large fluctuation in the common-mode voltage of the output side in accordance with the state of the load connected to the output side.

Figure 9:
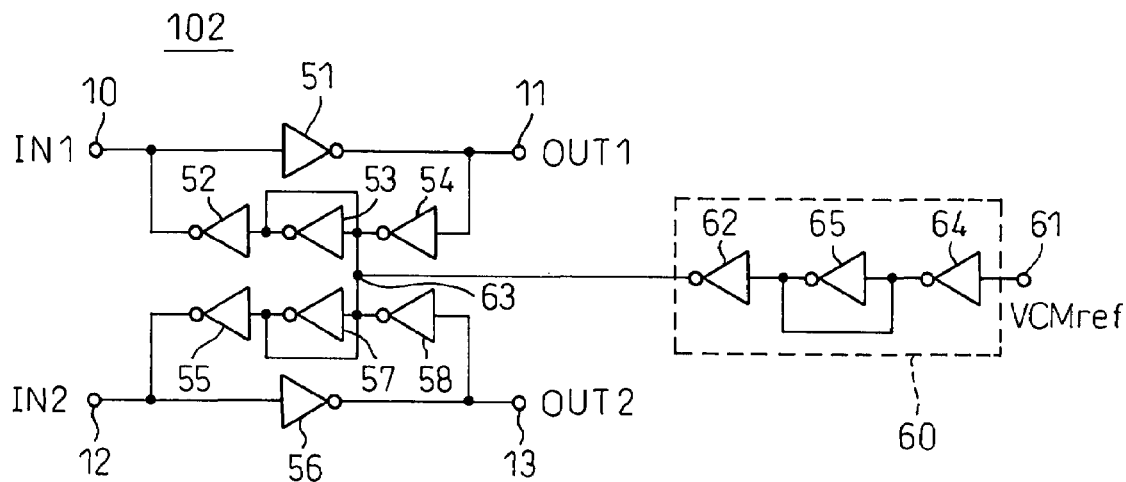
FIG. 9 is a circuit diagram of a modification of a fully-differential amplifier controlling common-mode voltage of an output side by a feedback operation of a third embodiment wherein the common-mode voltage of the output side is set to common-mode voltages different from the voltages giving equal input and output voltages of the component CMOS inverters.
Figure 10:
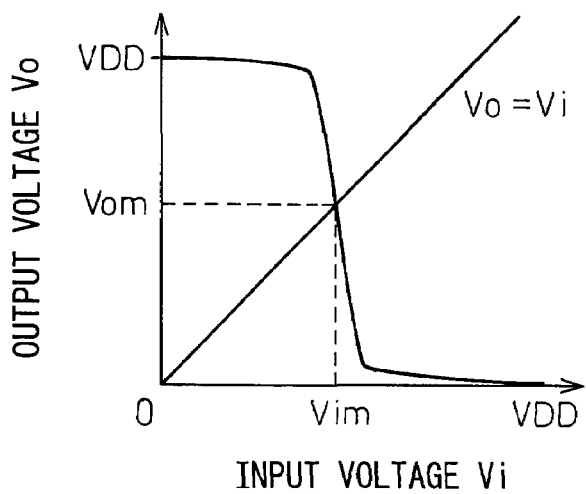
FIG. 10 is a view showing the characteristics of a CMOS inverter.

FIG. 9 is a circuit diagram for explaining a modification controlling the common-mode voltages of the outputs at the fully-differential amplifier 102 in a third embodiment of the present invention. In the configuration of the fully-differential amplifier 102 canceling out the common-mode signal of the output side by a feedback operation of the third embodiment shown in FIG. 8, the common-mode voltage of the outputs are set to a voltage where the input voltages and output voltages of the inverters forming the circuit become substantially equal due to the feedback action. Each single CMOS inverter has the input-output characteristics shown by the bold line in FIG. 10. The line of Vo=Vi in FIG. 10 shows the case where the input voltage and output voltage are equal, so if short-circuiting the input and output terminals of the CMOS inverter, the point of intersection of this line and the bold curve showing the input-output characteristics of the CMOS inverter becomes the operating point of the CMOS inverter. If the input voltage at this time is Vim and the output voltage is Vom, Vom=Vim. The voltages Vo1, Vo2 of the output terminals 11, 13 of FIG. 8 (FIG. 9) are converted to currents by the inverters 54, 58 and are input to the inverters 53, 57 with input and output ends short-circuited. The inverters 53 and 57 are connected with each other, so the currents supplied from the inverters 54, 58 are averaged at the node 63 of the inverters 53 and 57. The voltage VoC of this node becomes VoC=(Vo1+ Vo2)/2. Therefore, if VoC is larger than Vim, feedback acts to reduce the VoC to approach Vim, while if VoC is smaller than Vim, feedback acts to increase VoC to approach Vim and control is performed so that the common-mode voltage of the output terminals 11, 13 become Vim.

When desiring to control the common-mode voltage of the output terminals 11, 13 to become the value VCMref other than Vim, as known from the above discussion, it is sufficient to set the voltage of the node 63 to become VoC−VCMref. For that reason, in FIG. 9, the voltage control circuit 60 is used to control the voltage of the node 63. Specifically, the voltage control circuit 60 has an inverter 64 with the terminal 61 connected to the potential source of VCMref as an input, an inverter 65 with the input and output connected to the output of the inverter 64 and with the input and output short-circuited, and an inverter 62 connected to the input and output of the inverter 65, where the output of the inverter 62 is applied to the node 63. The inverters 64 and 65 form a buffer amplifier with a voltage gain of −1. Receiving as input the output of this buffer amplifier, the inverter 62 sends to the node 63 of the inverters 53 and 57 a current equivalent to 31 VCMref. The inverters 53, 57 have their input and output ends short-circuited and are connected with each other, so if seen from the inverter 62, appear like a 1/(2 gm) resistance. Therefore, if setting the transconductance value of the inverter 62 to two times the transconductance value of the other inverter, that is, 2gm, the voltage of the node 63 becomes VoC+VCMref unlike the above discussion. Therefore, in this case, if considering Vom as a reference and expressing it as VCMref=Vom+ΔV, feedback acts so that the common-mode voltage of the output approaches Vom−ΔV.

Figure 11:
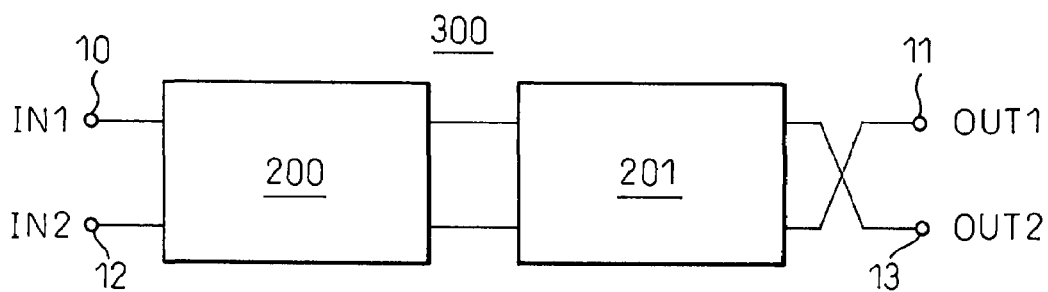
FIG. 11 is a view showing the configuration of a two-stage configuration fully-differential amplifier of a fourth embodiment of the present invention.

FIG. 11 is a circuit diagram showing the configuration of a two-stage configuration fully-differential amplifier 300 of a fourth embodiment of the present invention. In FIG. 11, reference numbers 10 and 12 indicate input terminals, 11 and 13 indicate output terminals, 200 indicates a fully-differential amplifier suppressing the common-mode signal of the input side by a feedforward operation, and 201 indicates a fully-differential amplifier suppressing the common-mode signal of the output side by a feedback operation. The fully-differential amplifier 300 of the fourth embodiment is configured by fully-differential amplifiers 200 and 201 connected in cascade. In FIG. 11, for the fully-differential amplifier 200, specifically the fully-differential amplifier 100 of the first embodiment of FIG. 6 of the present invention or the fully-differential amplifier 101 of an example of a second embodiment of FIG. 7 suppressing the common-mode signal of the input side by a feedforward operation can be used. In addition, the known Nauta OTA can be used. Further, for the fully-differential amplifier 201, a fully-differential amplifier 102 suppressing the common-mode signal of the output side by a feedback operation of a third embodiment of the present invention of FIG. 8 can be used. By cascade connecting a fully-differential amplifier suppressing the common-mode signal of the input side by a feedforward operation and a fully-differential amplifier suppressing the common-mode signal of the output signal by a feedback operation, the overall voltage gain can be made a product of the voltage gains of the fully-differential amplifiers and a large value can be realized. For example, if the gate length is made the minimum width in a 0.18 micron CMOS process, since the differential voltage gains of the fully-differential amplifiers of FIG. 7 and FIG. 8 are about 20 or so, a voltage gain of a fully-differential amplifier 300 of a fourth embodiment of FIG. 7 formed using these of about 400 or so is realized. When realizing an amplifier by the micro CMOS process, the problem of the small voltage gain can be resolved. Further, the problem in the conventionally proposed fully-differential amplifier operating at a low power supply voltage of 1V or so, that is, the inability to control the common-mode voltage of the output side, can also be solved in the present embodiment by using as the fully-differential amplifier 201 a fully-differential amplifier suppressing the common-mode signal of the output side by a feedback operation. Further, according to the configuration of this embodiment, the fully-differential amplifier 200 is a fully-differential amplifier suppressing the common-mode signal of the input side by a feedforward operation, so the later stage fully-differential amplifier 201 receives the common-mode signal of the input side greatly attenuated. The fully-differential amplifier 201 is a fully-differential amplifier suppressing the common-mode signal of the output side by a feedback operation, so the common-mode signal is greatly suppressed and overall extremely great suppression of the common-mode signal is realized.

S. Chatterjee, Y. Tsividis, P. Kinget, "A 0.5V Filter with PLL-Based Tuning in 0.18 μm CMOS," *Digest of Technical Papers, IEEE ISSCC2005*, 27.8, pp. 506-507, February 2005 and S. Chatterjee, Y. Tsividis, P. Kinget. "0.5-V Analog Circuit Techniques and Their Application in OTA and Filter Design," *IEEE Journal of Solid-State Circuits*, Vol. 40, No. 12, pp. 2373-2387, December 2005 also describe fully-differential amplifiers configured to suppress the common-mode component of input signals by a feedforward operation and suppress the common-mode component of the output side by a feedback operation. These are worked in single-stage amplifiers. Two single-stage fully-differential amplifiers provided with CMFF and CMFB functions are connected in cascade to form such fully-differential amplifiers. As opposed to this, in the fourth embodiment of the present invention, there is the difference that a single-stage fully-differential amplifier provided with just a CMFF and a single-stage fully-differential amplifier provided with just a CMFB are connected in a two-stage cascade configuration to form a fully-differential amplifier. Due to this, in the present invention, there are the advantages that it is possible to combine various amplification circuits at the stages and the degree of freedom of design becomes larger.

Further, in the fourth embodiment, when using as the second-stage fully-differential amplifier 201 the fully-differential amplifier 102 of FIG. 8, if using as the first-stage fully-differential amplifier 200 the fully-differential amplifier 100 or 101 of FIG. 6 or FIG. 7, the output resistance ro of the first-stage fully-differential amplifier becomes a considerably large value, and the loop gain of the common-mode feedback circuit of the second-stage fully-differential amplifier becomes $-g_m^2 \times r_o$, that is, becomes an extremely large value. Accordingly, an extremely large value can be realized as the second-stage common-mode suppression degree. In this way, by providing a two-stage amplification circuit by arranging a fully-differential amplifier suppressing the common-mode signal of the input side by a feedforward operation at the front stage and arranging a fully-differential amplifier suppressing the common-mode signal of the output side by a feedback operation at the rear stage, it is possible to realize a fully-differential amplifier having a large differential gain and an extremely small common-mode gain.

According to the results of calculation when all CMOS inverters are the same and their transconductance values are gm and output resistance values are ro (or output conductance value Go=1/ro), the voltage gain with respect to the differential signal, the voltage gain with respect to the common-mode signal, the output resistance with respect to the differential signal, and the output resistance with respect to the common-mode signal of each fully-differential circuit become as shown in Table 1.

TABLE 1

| Item | | Fully-differential amplifier | Fully-differential amplifier of FIG. 6 | Fully-differential amplifier of FIG. 7 |
|---|---|---|---|---|
| Trans-conductance | Differential-mode | $\dfrac{g_m}{2}$ | $\dfrac{g_m}{2}\left(1 + \dfrac{g_m}{2G_0 + g_m}\right) \approx g_m$ | $g_m$ |
| | Common-mode | $g_m$ | $g_m\left(1 - \dfrac{g_m}{2G_0 + g_m}\right) \approx 2G_0$ | $g_m\left(1 - \dfrac{g_m}{2G_0 + g_m}\right) \approx 2G_0$ |
| Output resistance | Differential-mode | $\dfrac{2}{3G_0}$ | $\dfrac{1}{G_0}$ | $\dfrac{1}{G_0}$ |
| | Common-mode | $\dfrac{1}{3G_0 + 2g_m}$ | $\dfrac{1}{2G_0}$ | $\dfrac{1}{2G_0}$ |
| Absolute value of voltage gain | Differential-mode | $\dfrac{g_m}{3G_0}$ | $\dfrac{g_m}{2G_0}\left(1 + \dfrac{g_m}{2G_0 + g_m}\right) \approx \dfrac{g_m}{G_0}$ | $\dfrac{g_m}{2G_0}$ |
| | Common-mode | $\dfrac{g_m}{3G_0 + 2g_m} \cong \dfrac{1}{2}$ | $\dfrac{g_m}{2G_0}\left(1 + \dfrac{g_m}{2G_0 + g_m}\right) \cong 1$ | $\dfrac{g_m}{2G_0}\left(1 + \dfrac{g_m}{2G_0 + g_m}\right) \cong 1$ |

According to the results of Table 1, in general Go<<gm, so in each fully-differential amplifier, the voltage gain with respect to the common-mode signal is 1 or less. Even if connecting these fully-differential amplifiers in a two-stage cascade configuration, the magnitude of the loop gain with respect to the common-mode signal becomes always 1 or less, so even with positive feedback, there is no oscillation and the stability can be secured.

pared with a conventional fully-differential amplifier configured by a differential pair, a remarkably large output amplitude can be obtained.

Figure 12A:
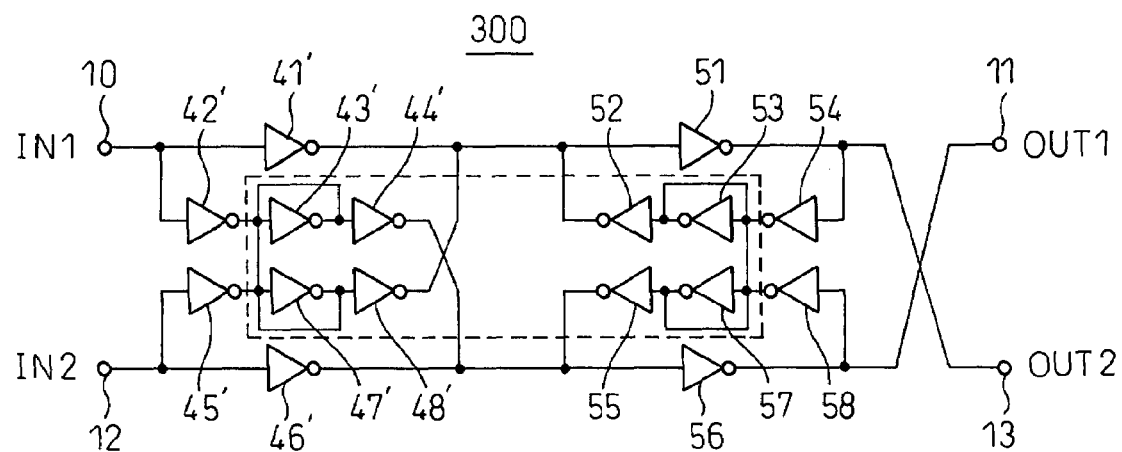
FIG. 12A is a specific circuit diagram of a two-stage configuration fully-differential amplifier of a fourth embodiment.
Figure 12B:
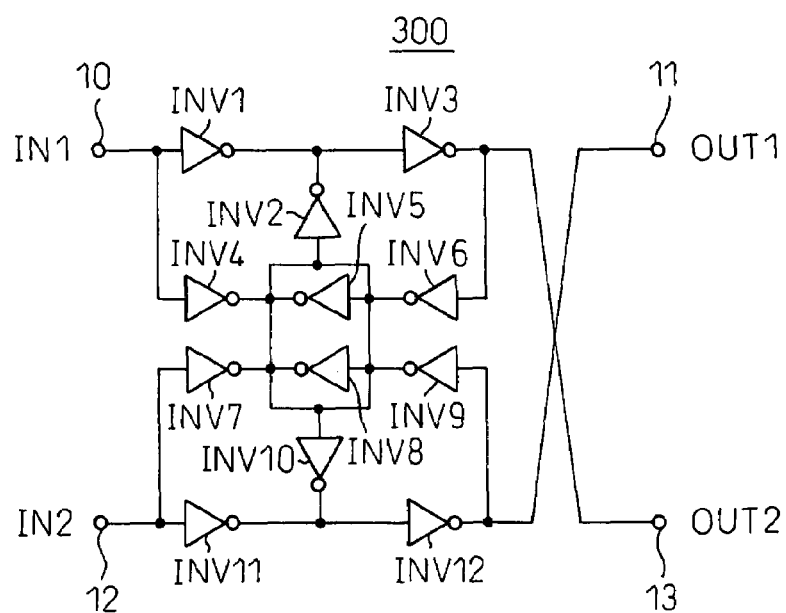
FIG. 12B is a circuit diagram of a modification simplifying the fully-differential amplifier of the FIG. 12A.

Further, the overall input and output characteristics of the fully-differential amplifier of FIG. 12B were analyzed by creating a model of the individual inverters with a transconductance gm and an output conductance Go. The results are shown in Table 2.

TABLE 2

|  | Differential-mode characteristic | Common-mode characteristic |
|---|---|---|
| Transconductance | $\dfrac{1}{2} \dfrac{g_{m1} g_{m3}}{G_{01} + G_{02}}$ | $\dfrac{g_{m3}(g_{m1}(G_{04} + G_{05} + G_{06} + g_{m5}) - g_{m2} g_{m4})}{(G_{01} + G_{02})(G_{04} + G_{05} + G_{06} + g_{m5})}$ |
| Output impedance | $\dfrac{1}{G_{03}} \times 2$ | $\dfrac{(G_{01} + G_{02})(G_{04} + G_{05} + G_{06} + g_{m5})}{G_{03}(G_{01} + G_{02})(G_{04} + G_{05} + G_{06} + g_{m5}) + g_{m2} g_{m3} g_{m6}}$ |
| Voltage gain | $\dfrac{g_{m1} g_{m3}}{G_{03}(G_{01} + G_{02})}$ | $\dfrac{g_{m3}(g_{m1}(G_{04} + G_{05} + G_{06} + g_{m5}) - g_{m2} g_{m4})}{G_{03}(G_{01} + G_{02})(G_{04} + G_{05} + G_{06} + g_{m5}) + g_{m2} g_{m3} g_{m6}}$ |

Further, from Table 1, the voltage gain with respect to the differential signal becomes largest in the order of the circuit of FIG. 6, the circuit of FIG. 7, and the Nauta OTA, while the gain of the circuit of FIG. 6 becomes 3 times the Nauta OTA, so if using the circuit of FIG. 6 for the first stage when forming the two-stage configuration fully-differential amplifier of the fourth embodiment of the present invention, there is the advantage that it is possible to realize a gain larger than about 10 dB.

FIG. 12A and FIG. 12B are views showing the specific circuit configuration of a two-stage configuration fully-differential amplification circuit 300 of the fourth embodiment of the present invention of FIG. 11 and a modification of the same. In the configuration of FIG. 11, when using as the fully-differential amplification circuit 200 the fully-differential amplifier 101 of FIG. 7 and as the fully-differential amplification circuit 201 the fully-differential amplifier 102 of FIG. 8, a circuit configuration as FIG. 12A is obtained, but the part surrounded by the broken line in FIG. 12A is common between the fully-differential amplification circuits 200 and 201. This can be combined into one. What is obtained in this way is the fully-differential circuit of FIG. 12B. The number of inverters used is reduced to 12 from 16 compared with FIG. 12A. Therefore, if using all the same inverters as the inverters forming the fully-differential amplifier, the power consumption falls to $^{12}/_{16}$ and a 25% reduction of power consumption is achieved. Further, the number of components is reduced, so the offset voltage etc. can be expected to become more resistant to the effects of manufacturing variations.

Figure 13:
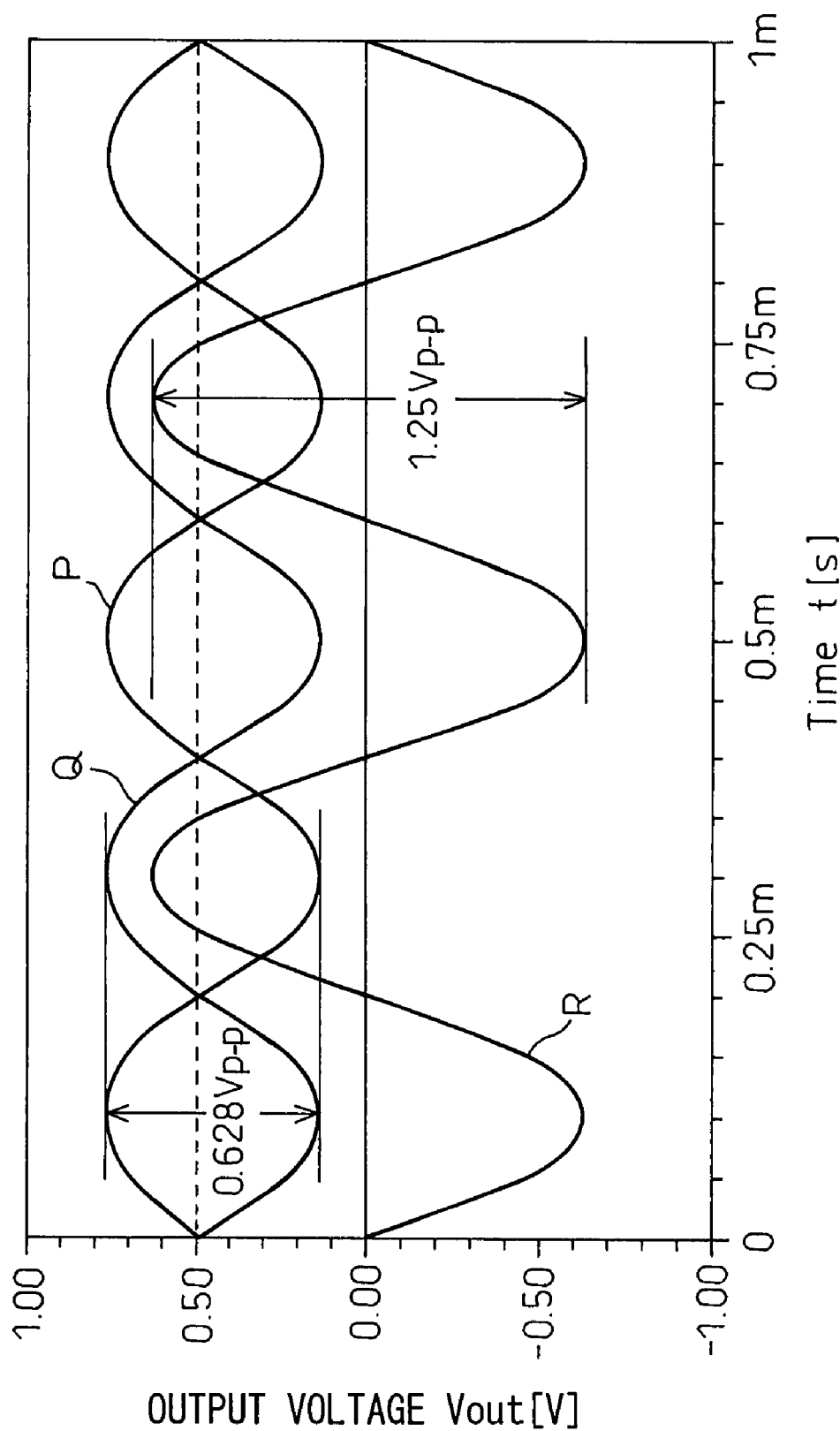
FIG. 13 is a graph of the results of simulation of output amplification when operating the two-stage configuration fully-differential amplifier of FIG. 12B by a power supply voltage of 1V.

FIG. 13 shows an example of the results of simulation of the voltages of the output ends 11, 13 when operating the fully-differential amplifier 300 of FIG. 12B by a power supply voltage of 1V using parameters of the 0.18 μm CMOS process. As inputs, sine voltages of an amplitude 0.6 mVp-p and 2.5 kHz are applied as differential input signals. The line shown by P is the waveform of the output voltage of the output terminal 13, while the line shown by Q is the waveform of the output voltage of the output terminal 11. Further, the line shown by R is a differential component between the output terminals 11, 13. It varies by 1.25 Vp-p with almost no distortion. In this way, according to the present invention, even at an operation at a power supply voltage 1V, it is clear that a differential output amplitude of 1V or more is obtained. Com- Note that the gm, Go of the inverters of the numbers $\underline{k}$ in FIG. 12B (INVk) are distinguished differentiated by the suffixes "k". As a result, FIG. 12B becomes a completely symmetric circuit, so from the results of analysis of the top half of the circuit, the same stands for the bottom half of the circuit if switching the numbers of the inverters like 1→11, 2→10, 3→12, 4→7, 5→8, 6→9. From the results of the table, the transconductance of the common-mode signal becomes zero when $g_{m1}(G_{o4}+G_{o5}+G_{o6}+g_{m5})=g_{m2}g_{m4}$. It is learned that the common-mode input is completely suppressed at the output side. This in principle can be realized by making the output conductances of INV4, INV5, and INV6 extremely small and making the transconductances of INV1, INV5, INV2, and INV4 large values and equal, but in reality, realization of this condition is difficult due to the performance and manufacturing variations in the devices.

Despite this, if performing calculations assuming gm>>Go from the equations of the voltage gain for the common-mode signals of the table for the case where all inverters have the same gm and Go, the voltage gain Avc with respect to the common-mode signal becomes approximately 3 Go/gm. The value of this Avc depends on the values of gm and Go of the specific device. Compared with the gain of about ¼ with respect to the common-mode input signal in the case of a two-stage cascade connection of Nauta OTA's studied before the present invention, a large improvement is expected.

Further, from Table 2, it is possible to estimate an important performance indicator of a fully-differential amplifier, that is, the common-mode rejection ratio (CMRR). In general, the CMRR is defined as the differential voltage gain÷common-mode voltage gain, but for simplification, it is assumed that the transconductances of all of the inverters are gm and the output conductance are Go. From Table 2, the CMRR can be calculated as follows:

$$CMRR = \frac{g_m^2}{2G_0^2} \frac{2G_0^2(3G_0 + g_m) + g_m^3}{g_m\{g_m(3G_0 + g_m) - g_m^2\}} = 1 + \frac{g_m}{3G_0} + \frac{1}{6}\left(\frac{g_m}{G_0}\right)^3 \approx \frac{1}{6}\left(\frac{g_m}{G_0}\right)^3$$

At the end of the modification of the equation, it was assumed that gm>>Go, but usually this assumption stands well. For example, with the 0.18 μm CMOS process, even if viewed conservatively, a gm/Go of about 20 or so can be easily realized, so a CMRR of about 63 dB or so can be easily realized. It is learned that the fully-differential amplifier according to the present invention can realize an extremely large CMRR.

FIG. 14 shows an example of the frequency characteristics of the voltage gain of a fully-differential amplifier according to the present invention fabricated using the configuration of FIG. 12B and actually using the 0.18 μm CMOS process and shows a good match with the results by circuit simulation. As a result of measurement at the power supply voltage 1V, the voltage gain at the low band is about 53 dB, the frequency where this attenuates by 3 dB is about 30 kHz, and the gain-band width product becomes about 13.4 MHz. The load capacity at this time is 16 pF for each output terminal, while the total current consumption of the fully-differential amplifier is about 59 μA. Therefore, the power consumption is about 59 μW. According to the present invention, it was actually confirmed that a large gain-band width product is obtained by an extremely small power consumption as projected.

Figure 15A:
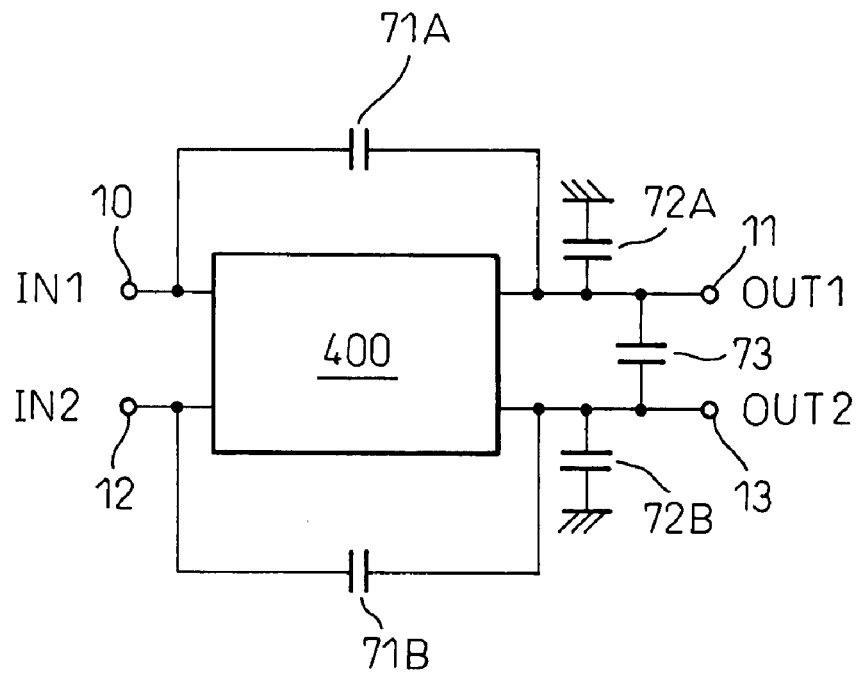
FIG. 15A and FIG. 15B are views showing examples of phase compensation circuits able to be applied to a single-stage configuration fully-differential amplifier of the present invention.
Figure 15B:
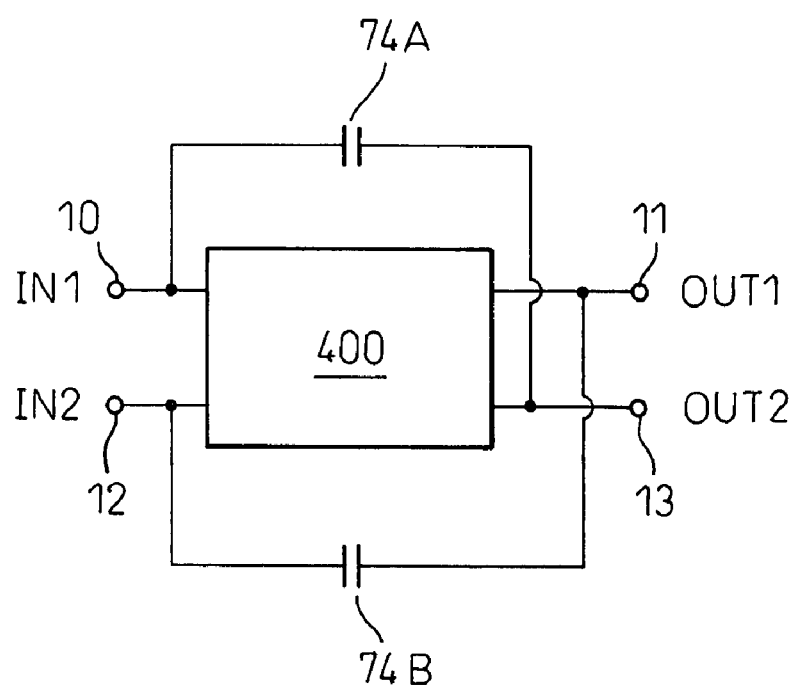

FIG. 15A and FIG. 15B are circuit diagrams for explaining phase compensation in a fully-differential amplifier of an embodiment of the present invention. FIG. 15A shows an embodiment of a phase compensation circuit able to be applied to one or both of the components of the two-stage configuration fully-differential amplifier 300 of the fourth embodiment of FIG. 11, that is, the fully-differential amplifiers 200 and 201. Here, as the single-stage fully-differential amplifier 400 of FIG. 15A, it is possible to use the single-stage configuration fully-differential amplifier shown in FIG. 6 to FIG. 8. In the two-stage configuration fully-differential amplifier of the fourth embodiment of the present invention, if the amount of negative feedback increases like with a conventional fully-differential amplifier, oscillation or other instability may be caused, so phase compensation is necessary for securing the stability. As is well known, phase compensation, as shown in FIG. 15A, adds the capacitors 72A, 72B for phase compensation or adds the capacitors 71A, 71B as mirror capacitors. In general, the method of adding capacitors 71A, 71B as mirror capacitors is known to be able to reduce the capacity value more than addition of the capacitors 72A, 72B. When adding the capacitors 71A, 71B or 72A, 72B for phase compensation, they act similarly with respect to the differential components and common-mode components of the signals. As opposed to this, as shown in the figure, when adding the phase compensation capacitor 73, there is no effect on the common-mode component of the signals and phase compensation works on only the differential component. In the single-stage differential amplifier of the present invention, the gain with respect to the common-mode signal becomes smaller than 1 and less phase compensation with respect to the common-mode signal is sufficient, so by adding a phase compensation capacitor 73 to the illustrated position, less of a capacity value is required, so this is effective.

FIG. 15B shows another embodiment of a phase compensation circuit able to be applied to one or both of the components of the two-stage configuration fully-differential amplifier of a fourth aspect of the present invention shown in FIG. 11, that is, the fully-differential amplifiers 200 and 201. This phase compensation method is based on the neutralization method known in the past. This is applied to the single-stage configuration fully-differential amplifier of the present invention. That is, the voltages of the input terminals 10, 12 become reverse in phase with respect to the differential signal. The voltages of the output terminals 11, 13 also become reverse in phase. Therefore, by arranging phase compensation capacitors 74A, 74B so as to give positive feedback to the differential components of the input signals, phase advancing compensation for the differential signal is possible. Due to this, the stability can be improved. For a common-mode signal, since the voltages of the input terminals 10, 12 are the same and the voltages of the output terminals 11, 13 are the same, these act as not positive feedback, but as negative feedback and perform the same functions as 71A, 71B of FIG. 15(A), so operate as phase retarded compensation.

Figure 16:
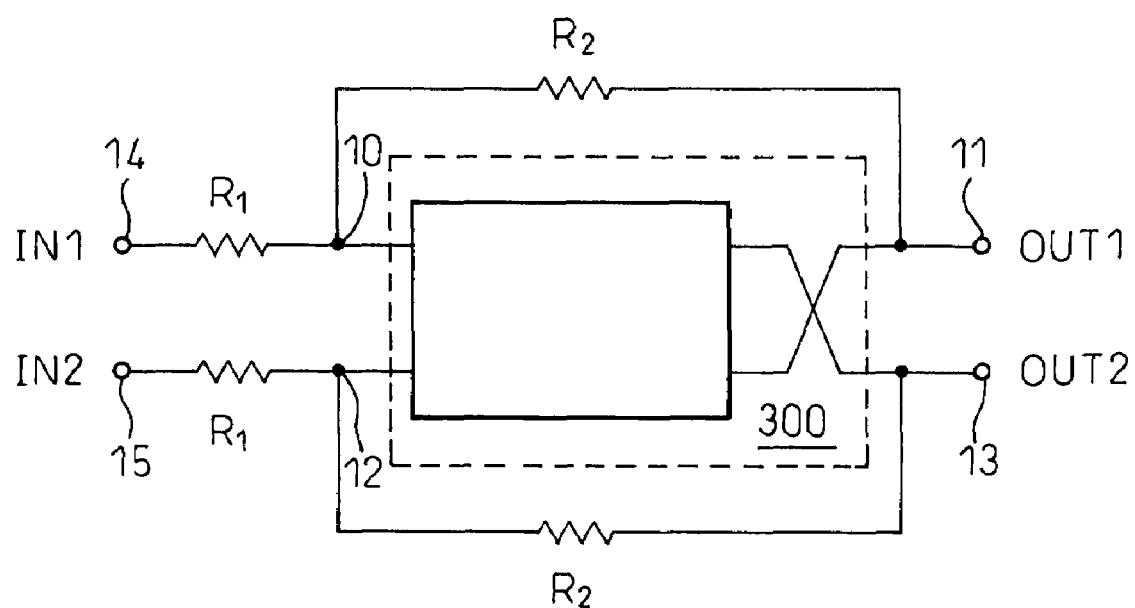
FIG. 16 is a view showing the configuration of an inverting amplifier using a two-stage configuration fully-differential amplifier according to the present invention.

FIG. 16 shows an example of lag application of the fully-differential amplifier 300 of the fourth embodiment to the configuration of an inverting amplifier. It provides feedback resistances R2 between the input terminals 10, 12 and output terminals 11, 13 of the fully-differential amplifier 300 and provides input resistances R1 between the input terminals 14, 15 of the inverting amplifier and the input terminals 10, 12 of the fully-differential amplifier 300 the present invention. By this circuit connection, the differential input signal voltages IN1, IN2 applied between the input terminals 14 and 15 are amplified by −R2/R1 and output between the output terminals 11 and 13. At this time, due to the effect of suppression of the common-mode signal, the common-mode signal applied between the input terminals 14 and 15 is not output much at all between the output terminals 11 and 13. Therefore, in the same way as an ordinary fully-differential amplifier, for example, if used in a state applying a signal to only the input terminal 14 and not applying a signal to the input terminal 15, the circuit outputs to the output terminals 11 and 13 the input signals amplified by −R2/R1 and opposite in phase and functions as a phase inverting circuit. Further, if connecting the capacitors C2 instead of the resistances R2 in FIG. 16, the circuit clearly operates as an integrator with a time constant of R1×C2. In the present embodiment, the example of application to a low pass filter was explained, but the invention can also be applied as a component circuit of a high pass filter, band pass filter, or other various types of filters of course.

Figure 17:
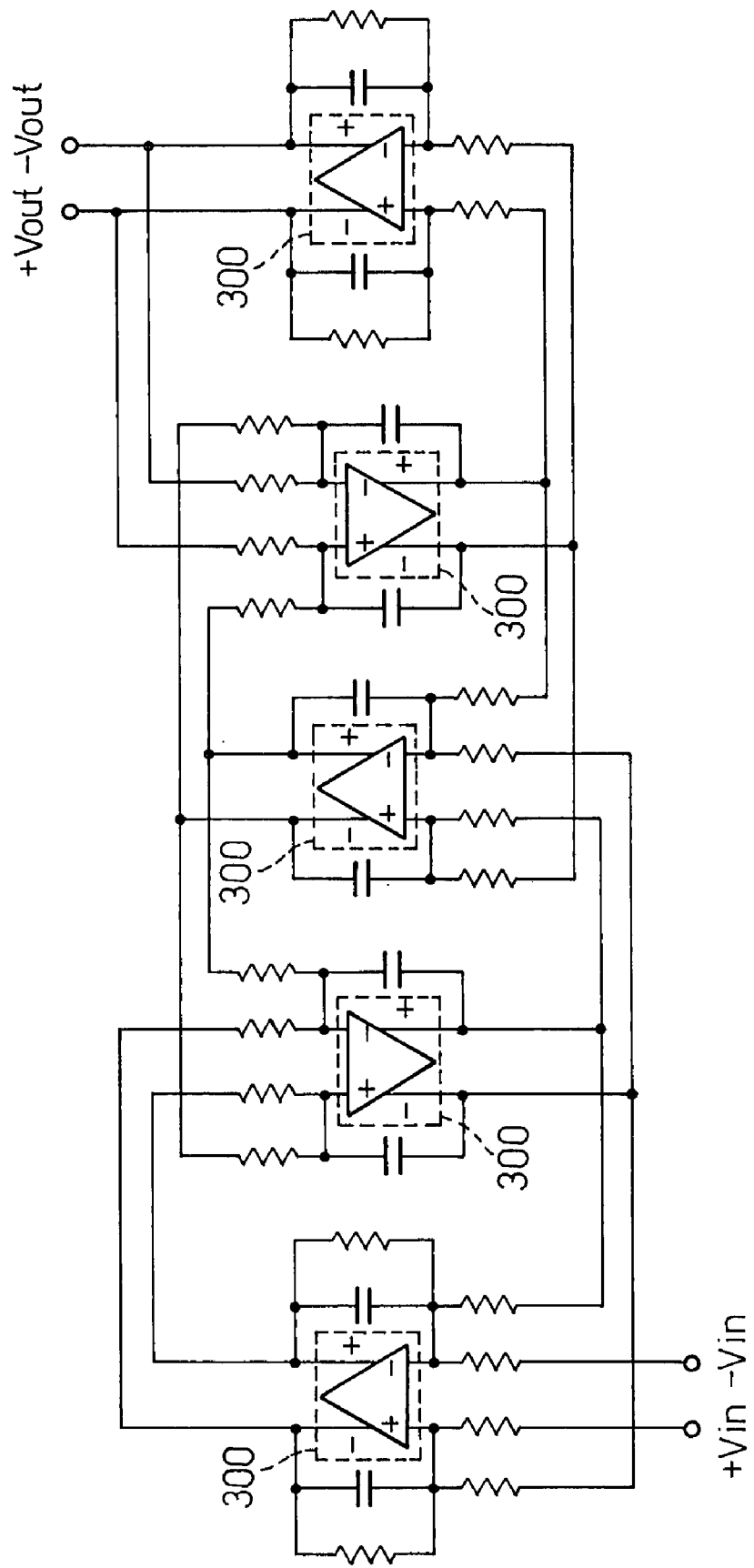
FIG. 17 is a view showing an example of application of fully-differential amplifiers according to the present invention to an active filter.

FIG. 17 shows an embodiment forming an active filter using a two-stage fully-differential amplification circuit 300 of the fourth embodiment of the present invention of FIG. 11. According to the present invention, the common-mode voltages of the output are automatically set to near substantially ½ of the power supply voltage, so even with operation under a low power supply voltage, there is the advantage that additional circuits for setting the common-mode voltage of the output are not necessary like with the fully-differential amplifier of S. Chatterjee, Y. Tsividis, P. Kinget, "0.5-V Analog Circuit Techniques and Their Application in OTA and Filter Design," *IEEE Journal of Solid-State Circuits,* Vol. 40, No. 12, pp. 2373-2387, December 2005 and the biggest output voltage swing can be obtained.

Figure 1:
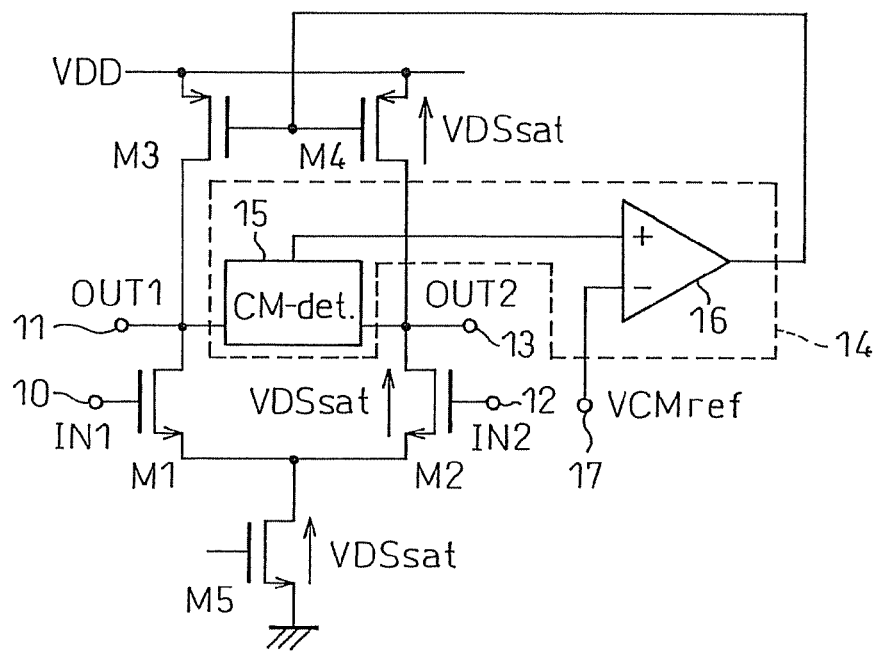
FIG. 1 is a view showing a conventional differential amplification circuit performing a feedback operation on an output common-mode signal.
Figure 2A:
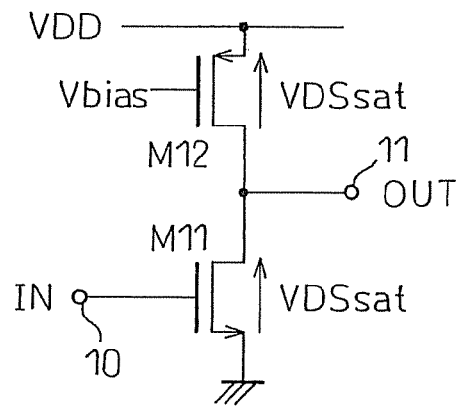
FIG. 2A is a view showing the configuration of a single-end inverting amplifier.
Figure 2B:
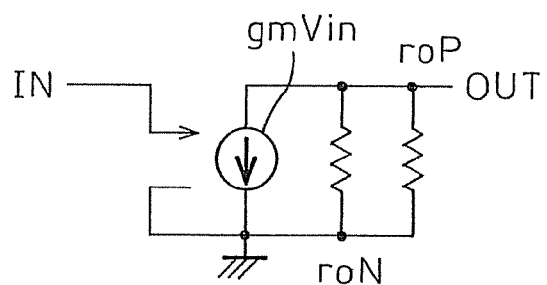
FIG. 2B is a view showing a small signal equivalent circuit of a single-end inverting amplifier of FIG. 2A.
Figure 3A:
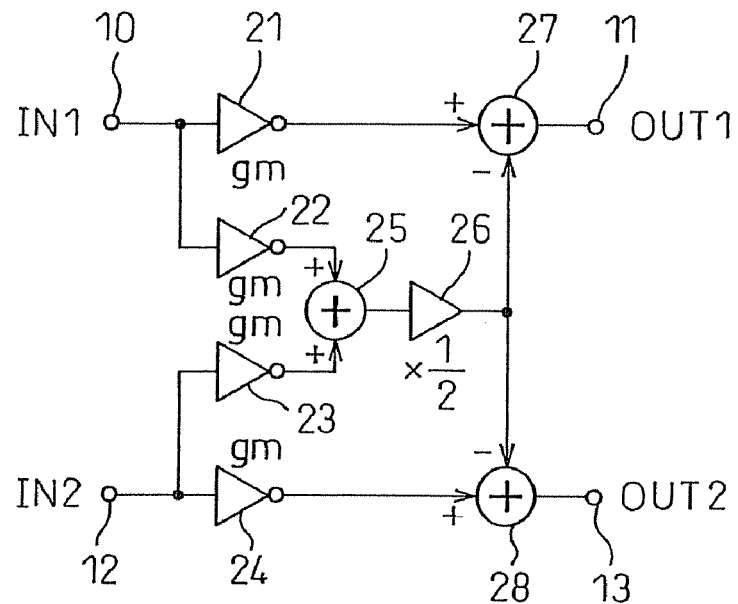
FIG. 3A and FIG. 3B are views for explaining the configurations of single-stage fully-differential amplifiers suppressing common-mode components of input and output signals by feedforward and feedback operations.
Figure 3B:
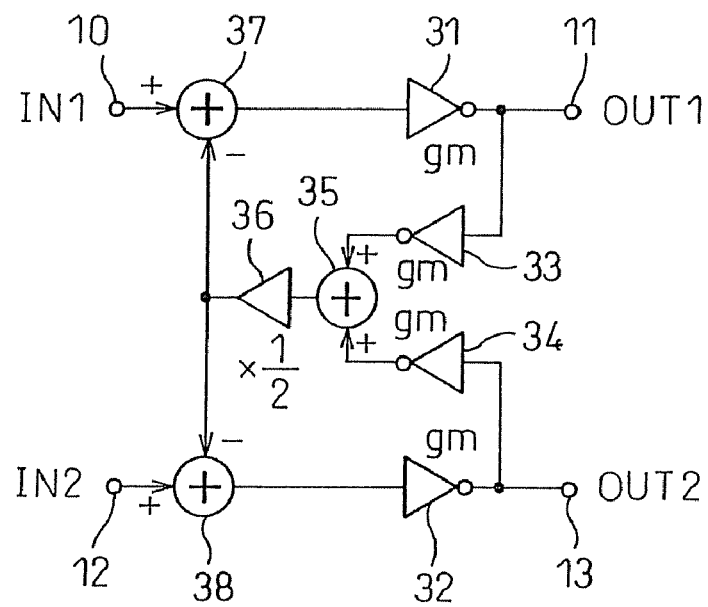
Figure 4A:
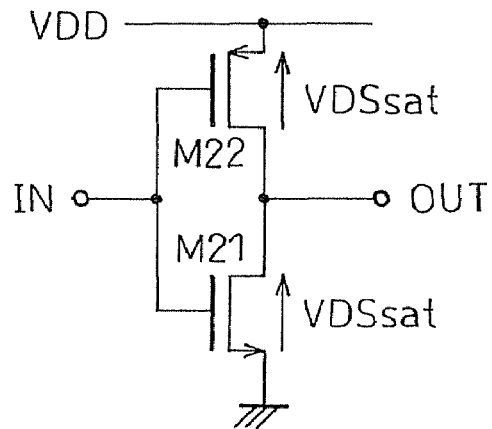
FIG. 4A is a view showing a circuit of a CMOS inverter.
Figure 4B:
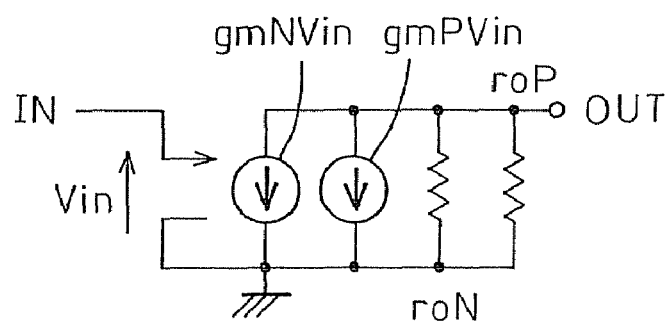
FIG. 4B is a view showing a small signal equivalent circuit for the CMOS inverter of FIG. 4A.
Figure 4C:
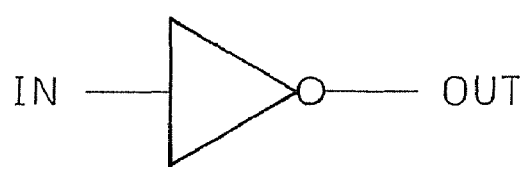
FIG. 4C is a view showing the symbol of a CMOS inverter.
Figure 5:
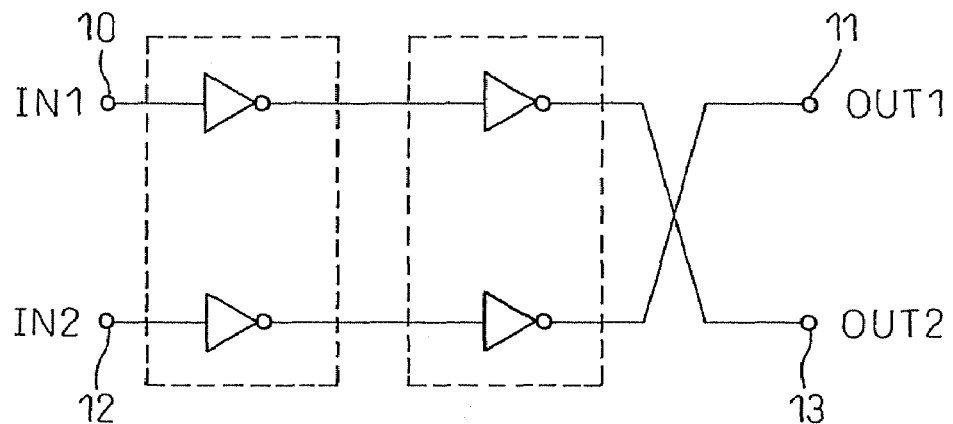
FIG. 5 is a circuit diagram for explaining an example of a two-stage configuration fully-differential amplifier considered in the past.

As explained above, in the present invention, CMOS inverters are used as the basic component circuits, that is, the single-stage single-end inverting amplifiers, but even if using the grounded source current source load amplification circuits shown in FIG. 2A, it is naturally possible to obtain exactly the same effects other than that sometimes a level shift of the input side common-mode voltage sometimes becomes necessary. Therefore, it is also possible to configure the fully-differential amplifier of FIG. 6 to FIG. 8 by the inverters of FIG. 2A and make various other modifications. Further, in the inverter of FIG. 2A, it is possible to continuously change the transconductance value of the fully-differential amplifier in accordance with the change of the value of the current source of the load, so there is also the advantage that a variable filter etc. can be easily realized.

The present invention can be applied to any amplifier so long as a fully-differential amplifier. It is particularly applied to an analog amplifier provided in a highly integrated IC chip operating at a low voltage.

The invention claimed is:

1. A fully-differential amplifier provided with
   a first fully-differential amplifier configured by single-stage configuration inverting amplifiers and canceling out a common-mode signal of an input side by a feedforward means and
   a second fully-differential amplifier configured by single-stage configuration inverting amplifiers and canceling out a common-mode signal of an output side by a feedback means,
   an output of said first fully-differential amplifier being connected to an input of said second fully-differential amplifier.

2. The fully-differential amplifier as set forth in claim 1, wherein said first fully-differential amplifier is a fully-differential amplifier amplifying a difference of first and second input signals input to first and second input terminals and outputting first and second output signals to first and second output terminals, said first fully-differential amplifier comprises:
   a first single-stage configuration inverting amplifier connected between said first input terminal and said first output terminal,
   a second single-stage configuration inverting amplifier connected between said second input terminal and said second output terminal;
   a third single-stage configuration inverting amplifier with said first input terminal as an input,
   a fourth single-stage configuration inverting amplifier with an input and output connected to an output of said third inverting amplifier and with the input and output short-circuited,
   a fifth single-stage configuration inverting amplifier with an input connected to a short-circuited input and output of said fourth inverting amplifier and with an output connected to said second output terminal;
   a sixth single-stage configuration inverting amplifier with said second input terminal as an input;
   a seventh single-stage configuration inverting amplifier with an input and output connected to an output of said sixth inverting amplifier and with the input and output short-circuited; and
   an eighth single-stage configuration inverting amplifier with an input connected to a short-circuited input and output of said seventh inverting amplifier and with an output connected to said first output terminal,
   a common-mode signal of an input side is cancelled out by a feedforward operation.

3. The fully-differential amplifier as set forth in claim 1, wherein said first fully-differential amplifier is a fully-differential amplifier amplifying a difference of first and second input signals input to first and second input terminals and outputting first and second output signals to first and second output terminals, said first fully-differential amplifier comprises:
   a first single-stage configuration inverting amplifier connected between said first input terminal and said first output terminal;
   a second single-stage configuration inverting amplifier connected between said second input terminal and said second output terminal;
   a third single-stage configuration inverting amplifier with said first input terminal as an input;
   a fourth single-stage configuration inverting amplifier with an input and output connected to an output of said third inverting amplifier and with the input and output short-circuited;
   a fifth single-stage configuration inverting amplifier with an input connected to a short-circuited input and output of said fourth inverting amplifier and with an output connected to one of said first and second output terminals;
   a sixth single-stage configuration inverting amplifier with said second input terminal as an input;
   a seventh single-stage configuration inverting amplifier with an input and output connected to an output of said sixth inverting amplifier and with the input and output short-circuited; and
   an eighth single-stage configuration inverting amplifier with an input connected to a short-circuited input and output of said seventh inverting amplifier and with an output connected to said first output terminal,
   a short-circuited input and output of said fourth inverting amplifier and a short-circuited input and output of said seventh inverting amplifier are short-circuited, and
   an input side common-mode signal is cancelled out by a feedforward operation.

4. The fully-differential amplifier as set forth in claim 2, wherein said second fully-differential amplifier is a fully-differential amplifier amplifying a difference of first and second input signals input to first and second input terminals and outputting first and second output signals to first and second output terminals, said second fully-differential amplifier comprises:
   a first single-stage configuration inverting amplifier connected between said first input terminal and said first output terminal;
   a second single-stage configuration inverting amplifier connected between said second input terminal and said second output terminal;
   a third single-stage configuration inverting amplifier with said first output terminal as an input;
   a fourth single-stage configuration inverting amplifier with an input and output connected to an output of said third inverting amplifier and with an input and output short-circuited;
   a fifth single-stage configuration inverting amplifier with an input connected to a short-circuited input-output of said fourth inverting amplifier and with an output connected to one of said first and second input terminals;
   a sixth single-stage configuration inverting amplifier with said second output terminal as an input;
   a seventh single-stage configuration inverting amplifier with an input and output connected to an output of said sixth inverting amplifier and with an input and output short-circuited ; and
   an eighth single-stage configuration inverting amplifier with an input connected to a short-circuited input-output of said seventh inverting amplifier and with an output connected to another of said first and second input terminals,
   a short-circuited input-output of said fourth inverting amplifier and short-circuited input-output of said seventh inverting amplifier are short-circuited, and
   an output side common-mode signal is cancelled out by a feedback operation.

5. The fully-differential amplifier as set forth in claim 3, wherein said second fully-differential amplifier is a fully-differential amplifier amplifying a difference of first and second input signals input to first and second input terminals and outputting first and second output signals to first and second output terminals, said second fully-differential amplifier comprises:

a first single-stage configuration inverting amplifier connected between said first input terminal and said first output terminal;

a second single-stage configuration inverting amplifier connected between said second input terminal and said second output terminal;

a third single-stage configuration inverting amplifier with said first output terminal as an input;

a fourth single-stage configuration inverting amplifier with an input and output connected to an output of said third inverting amplifier and with an input and output short-circuited;

a fifth single-stage configuration inverting amplifier with an input connected to a short-circuited input-output of said fourth inverting amplifier and with an output connected to one of said first and second input terminals;

a sixth single-stage configuration inverting amplifier with said second output terminal as an input;

a seventh single-stage configuration inverting amplifier with an input and output connected to an output of said sixth inverting amplifier and with an input and output short-circuited; and an eighth single-stage configuration inverting amplifier with an input connected to a short-circuited input-output of said seventh inverting amplifier and with an output connected to another of said first and second input terminals, a short-circuited input-output of said fourth inverting amplifier and short-circuited input-output of said seventh inverting amplifier are short-circuited, and an output side common-mode signal is cancelled out by a feedback operation.

6. The fully-differential amplifier as set forth in claim 1, wherein said second fully-differential amplifier is a fully-differential amplifier amplifying a difference of first and second input signals input to first and second input terminals and outputting first and second output signals to first and second output terminals, said second fully-differential amplifier comprises:

a first single-stage configuration inverting amplifier connected between said first input terminal and said first output terminal;

a second single-stage configuration inverting amplifier connected between said second input terminal and said second output terminal;

a third single-stage configuration inverting amplifier with said first output terminal as an input;

a fourth single-stage configuration inverting amplifier with an input and output connected to an output of said third inverting amplifier and with an input and output short-circuited;

a fifth single-stage configuration inverting amplifier with an input connected to a short-circuited input-output of said fourth inverting amplifier and with an output connected to one of said first and second input terminals;

a sixth single-stage configuration inverting amplifier with said second output terminal as an input;

a seventh single-stage configuration inverting amplifier with an input and output connected to an output of said sixth inverting amplifier and with an input and output short-circuited; and an eighth single-stage configuration inverting amplifier with an input connected to a short-circuited input-output of said seventh inverting amplifier and with an output connected to another of said first and second input terminals, a short-circuited input-output of said fourth inverting amplifier and short-circuited input-output of said seventh inverting amplifier short-circuited, and an output side common-mode signal is cancelled out by a feedback operation.

7. The fully-differential amplifier as set forth in claim 1, wherein said single-stage configuration inverting amplifiers forming said first and second fully-differential amplifiers are CMOS inverters.

8. The fully-differential amplifier as set forth in claim 1, wherein said single-stage configuration inverting amplifiers forming said first and second fully-differential amplifiers are inverters are comprised of first grounded source MOSFETs to which MOSFETs of opposite polarity conductivity types as said first grounded source MOSFETs are connected as current source loads.

9. The fully-differential amplifier as set forth in claim 1, comprising a simplified fully-differential amplifier amplifying a difference of first and second input signals input to first and second input terminals and outputting first and second output signals to first and second output terminals, said simplified fully-differential amplifier comprises:

first and second single-stage configuration inverting amplifiers connected in series between said first input terminal and said first output terminal;

third and fourth single-stage configuration inverting amplifiers connected between said second input terminal and said second output terminal;

a fifth single-stage configuration inverting amplifier with said first input terminal as an input;

a sixth single-stage configuration inverting amplifier with said first output terminal as an input;

a seventh single-stage configuration inverting amplifier with an input and output connected to outputs of said fifth and sixth single-stage configuration inverting amplifiers and with an input and output short-circuited;

an eighth single-stage configuration inverting amplifier with an input connected to a short-circuited input and output of said seventh inverting amplifier and with an output connected to a node of said first and second single-stage configuration inverting amplifiers;

a ninth single-stage configuration inverting amplifier with said second input terminal as an input, a 10th single-stage configuration inverting amplifier with said second output terminal as an input, an 11th single-stage configuration inverting amplifier with an input and output connected to outputs of said ninth and 10th single-stage configuration inverting amplifiers and with an input and output short-circuited, and a 12th single-stage configuration inverting amplifier with an input connected to short-circuited input-outputs of said 11th inverting amplifier and with an output connected to a node of said third and fourth single-stage configuration inverting amplifiers.

* * * * *

UNITED STATES PATENT AND TRADEMARK OFFICE
CERTIFICATE OF CORRECTION

PATENT NO. : 7,619,473 B2  Page 1 of 1
APPLICATION NO. : 11/812378
DATED : November 17, 2009
INVENTOR(S) : Hiroshi Tanimoto et al.

It is certified that error appears in the above-identified patent and that said Letters Patent is hereby corrected as shown below:

Column 24, Line 8, after "amplifier" insert --are--.

Signed and Sealed this

Twenty-sixth Day of January, 2010

David J. Kappos
*Director of the United States Patent and Trademark Office*